(12) United States Patent
Kwak

(10) Patent No.: US 10,971,211 B2
(45) Date of Patent: Apr. 6, 2021

(54) SEMICONDUCTOR DEVICES FOR RECOGNIZING A PHASE OF A DIVISION CLOCK SIGNAL

(71) Applicant: SK hynix Inc., Icheon-si (KR)

(72) Inventor: Kang Sub Kwak, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/570,375

(22) Filed: Sep. 13, 2019

(65) Prior Publication Data
US 2020/0211618 A1 Jul. 2, 2020

(30) Foreign Application Priority Data
Dec. 27, 2018 (KR) .......................... 10-2018-0171067

(51) Int. Cl.
*G11C 11/4076* (2006.01)
*G11C 11/4093* (2006.01)
*G11C 11/4096* (2006.01)

(52) U.S. Cl.
CPC ...... *G11C 11/4076* (2013.01); *G11C 11/4093* (2013.01); *G11C 11/4096* (2013.01)

(58) Field of Classification Search
CPC ............ G11C 11/4076; G11C 11/4093; G11C 11/4096; G11C 7/222; H03L 7/06; G06F 1/12
See application file for complete search history.

(56) References Cited

U.S. PATENT DOCUMENTS

| | | | |
|---|---|---|---|
| 9,818,462 B1 | 11/2017 | Polney | |
| 2011/0158030 A1* | 6/2011 | Bae | H03L 7/06 365/233.1 |
| 2013/0300477 A1* | 11/2013 | Ueda | H03L 7/10 327/159 |

FOREIGN PATENT DOCUMENTS

KR      1020110024200 A      3/2011

\* cited by examiner

*Primary Examiner* — David Lam
(74) *Attorney, Agent, or Firm* — William Park & Associates Ltd.

(57) ABSTRACT

A semiconductor device includes a phase difference detection circuit and an internal circuit. The phase difference detection circuit generates first and second phase difference detection signals by comparing a phase of a phase detection clock signal, generated from a command/address signal in synchronization with a clock signal, with phases of a division clock signal and an internal division clock signal that are generated by dividing a frequency of a data clock signal according to an operation mode. The internal circuit recognizes the phases of the division clock signal and the internal division clock signal according to a logic level combination of the first and second phase difference detection signals.

27 Claims, 15 Drawing Sheets

FIG. 2

| CLK | CS | CA<1> | CA<2> | CA<3> | CA<4> | CA<5> | CA<6> | CA<7> |
|---|---|---|---|---|---|---|---|---|
| Rising | H | L | L | H | H | WS_WR | WS_RD | WS_FS |

FIG. 13

| OPERATION MODE | PDIF<1> | PDIF<2> | |
|---|---|---|---|
| FIRST OPERATION MODE | L | X | SWCK |
| | H | X | IWCK |
| SECOND OPERATION MODE | L | L | IWCKB |
| | L | H | IWCK_SD |
| | H | L | IWCK_SDB |
| | H | H | IWCKB_SD |
| | | | IWCKB_SDB |

SEMICONDUCTOR DEVICES FOR RECOGNIZING A PHASE OF A DIVISION CLOCK SIGNAL

CROSS-REFERENCE TO RELATED APPLICATIONS

The present application claims priority under 35 U.S.C 119(a) to Korean Application No. 10-2018-0171067, filed on Dec. 27, 2018, which is incorporated herein by reference in its entirety.

BACKGROUND

1. Technical Field

Embodiments of the present disclosure relate to semiconductor devices operating in synchronization with a division clock signal.

2. Related Art

In general, semiconductor devices, such as dynamic random access memory (DRAM) devices, may include a plurality of bank groups having cell arrays which are selected by addresses. Each bank group may include a plurality of banks. A semiconductor device may select any one of a plurality of bank groups and perform a column operation for outputting data stored in a cell array included in the selected bank group through input/output (I/O) lines. Additionally, the semiconductor device may operate in synchronization with a clock signal provided by an external device. Particularly, the semiconductor device may use a division clock signal, which is obtained by dividing a frequency of the clock signal, to improve an operation speed of the semiconductor device.

SUMMARY

According to an embodiment, a semiconductor device includes a phase difference detection circuit and an internal circuit. The phase difference detection circuit generates first and second phase difference detection signals by comparing a phase of a phase detection clock signal, generated from a command/address signal in synchronization with a clock signal, with phases of a division clock signal and an internal division clock signal that are generated by dividing a frequency of a data clock signal according to an operation mode. The internal circuit recognizes the phases of the division clock signal and the internal division clock signal according to a logic level combination of the first and second phase difference detection signals.

According to another embodiment, a semiconductor device includes a frequency division circuit and a phase comparison circuit. The frequency division circuit divides a frequency of a data clock signal according to a logic level of a mode signal for setting a first operation mode or a second operation mode to generate first to fourth division clock signals and first to fourth internal division clock signals with frequencies that vary. The frequency division circuit outputs the fourth division clock signal, the first internal division clock signal, and the third internal division clock signal. The phase comparison circuit compares a phase of a phase detection clock signal generated in synchronization with a clock signal with a phase of the fourth division clock signal to generate a first phase difference detection signal. In addition, the phase comparison circuit compares the phase of the phase detection clock signal with phases of the first and third internal division clock signals to generate a second phase difference detection signal.

According to yet another embodiment, a semiconductor device includes a phase difference detection circuit, a clock selection circuit, and a phase change circuit. The phase difference detection circuit generates a first phase difference detection signal and a second phase difference detection signal by comparing a phase of a phase detection clock signal, generated from a command/address signal in synchronization with a clock signal, with phases of first to fourth division clock signals and first to fourth internal division clock signals that are generated by dividing a frequency of a data clock signal according to an operation mode. In addition, the phase difference detection circuit generates a command pulse having the same phase as the clock signal. The clock selection circuit outputs any one of the first to fourth division clock signals and the first to fourth internal division clock signals as a selection clock signal according to a logic level combination of the first phase difference detection signal and the second phase difference detection signal. The phase change circuit performs a domain crossing operation that changes a phase of the command pulse into a phase of the selection clock signal to generate a phase change command pulse.

According to still another embodiment, a semiconductor device includes a phase difference detection circuit and a phase change circuit. The phase difference detection circuit generates a first phase difference detection signal and a second phase difference detection signal by comparing a phase of a phase detection clock signal, generated from a command/address signal in synchronization, with a clock signal and with phases of first to fourth division clock signals and first to fourth internal division clock signals that are generated by dividing a frequency of a data clock signal according to an operation mode. In addition, the phase difference detection circuit generates a command pulse having the same phase as the clock signal. The phase change circuit generates first to fourth phase change command pulses by performing a domain crossing operation that changes a phase of the command pulse into any one of phases of the first to fourth division clock signals and first to fourth internal division clock signals according to a logic level combination of the first and second phase difference detection signals.

BRIEF DESCRIPTION OF THE DRAWINGS

FIG. 2 is a table illustrating a logic level combination of a chip selection signal and a command/address signal for generating an internal command used in a semiconductor device according to an embodiment of the present disclosure.

FIG. 13 is a table illustrating logic levels of a phase difference detection signal for generating a selection signal in first and second modes of a semiconductor device according to an embodiment of the present disclosure.

DETAILED DESCRIPTION OF THE EMBODIMENTS

Various embodiments of the present disclosure are described herein with reference to the accompanying drawings. However, the described embodiments are for illustrative purposes only and are not intended to limit the scope of the present disclosure.

In the present disclosure, semiconductor devices may provide a bank group mode, an 8-bank mode or a 16-bank mode. A bank group may include a plurality of banks. For example, a bank group may include four banks. In the bank group mode, a column operation for one bank included in the bank group may be performed by one command. In the 8-bank mode, column operations for two banks respectively included in separate bank groups are sequentially performed by one command. In the 16-bank mode, column operations for four banks respectively included in separate bank groups are sequentially performed by one command.

Figure 1:
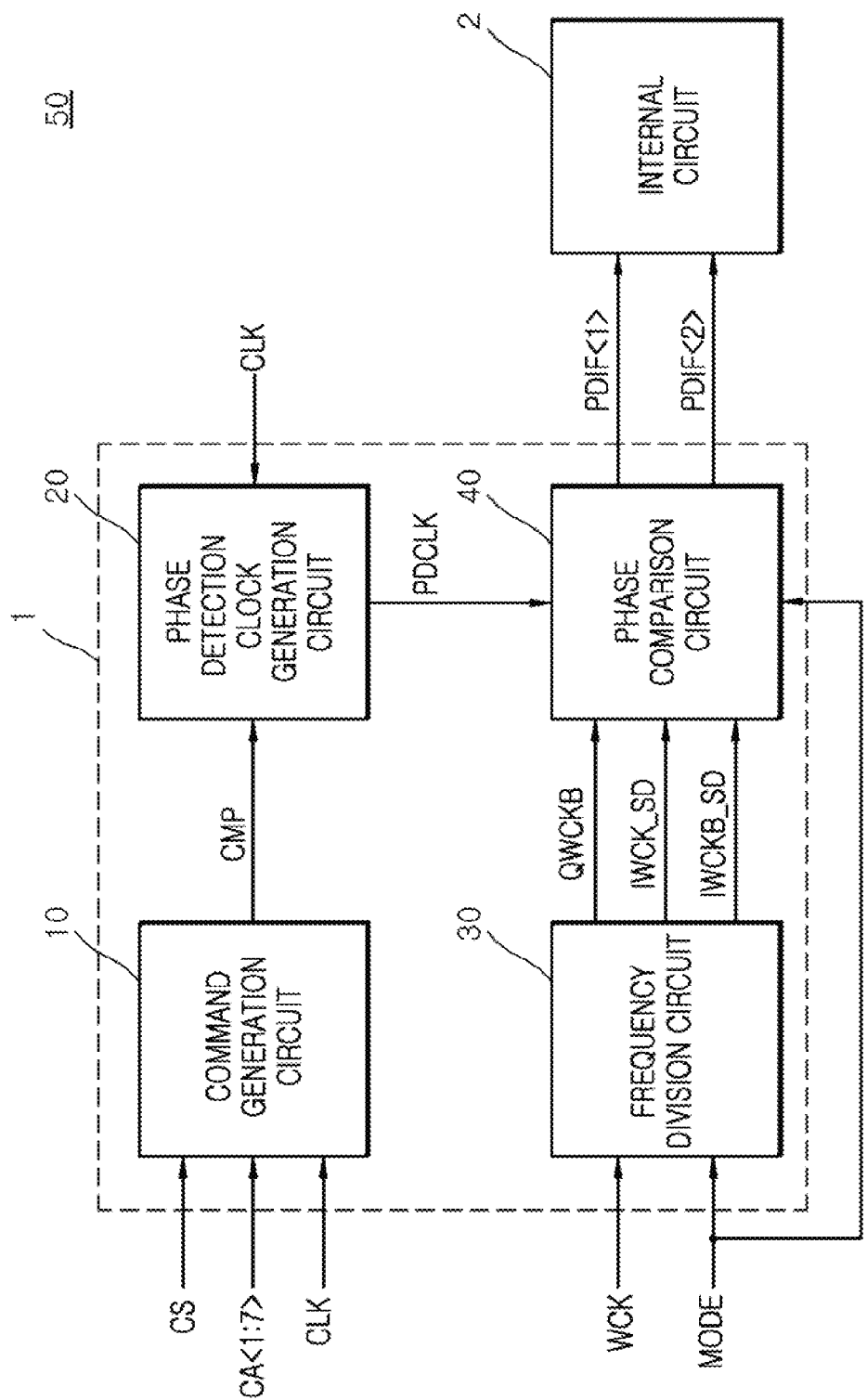
FIG. 1 is a block diagram illustrating a configuration of a semiconductor device according to an embodiment of the present disclosure.

As illustrated in FIG. 1, a semiconductor device 50, according to an embodiment, may include a phase difference detection circuit 1 and an internal circuit 2.

The phase difference detection circuit 1 may include a command generation circuit 10, a phase detection clock generation circuit 20, a frequency division circuit 30, and a phase comparison circuit 40.

The command generation circuit 10 may be synchronized with a clock signal CLK to generate an internal command CMP from a chip selection signal CS and first to seventh command/address signals CA<1:7>. The command generation circuit 10 may be synchronized with the clock signal CLK to receive the chip selection signal CS and may generate the internal command CMP including a pulse which is created if the first to seventh command/address signals CA<1:7> have a predetermined logic level combination. Although FIG. 1 illustrates an example in which the number of bits included in the command/address signals CA<1:7> is seven, the present disclosure is not limited thereto. For example, the number of bits included in the command/address signals may be set differently in different embodiments. The predetermined logic level combination of the first to seventh command/address signals CA<1:7> for generating the internal command CMP is described in detail with reference to FIG. 2 below. The word "predetermined" as used herein with respect to a parameter, such as the predetermined logic level combination of the first to seventh command/address signals CA<1:7> or a predetermined period of enablement for a phase detection clock signal, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The phase detection clock generation circuit 20 may be synchronized with the internal command CMP to generate a phase detection clock signal PDCLK which is enabled during a predetermined period. The phase detection clock generation circuit 20 may generate the phase detection clock signal PDCLK having the same phase as the clock signal CLK if the pulse of the internal command CMP is created. The phase detection clock generation circuit 20 may shift the internal command CMP to generate the phase detection clock signal PDCLK. A shift time of the internal command CMP may be set differently in different embodiments.

Figure 4:
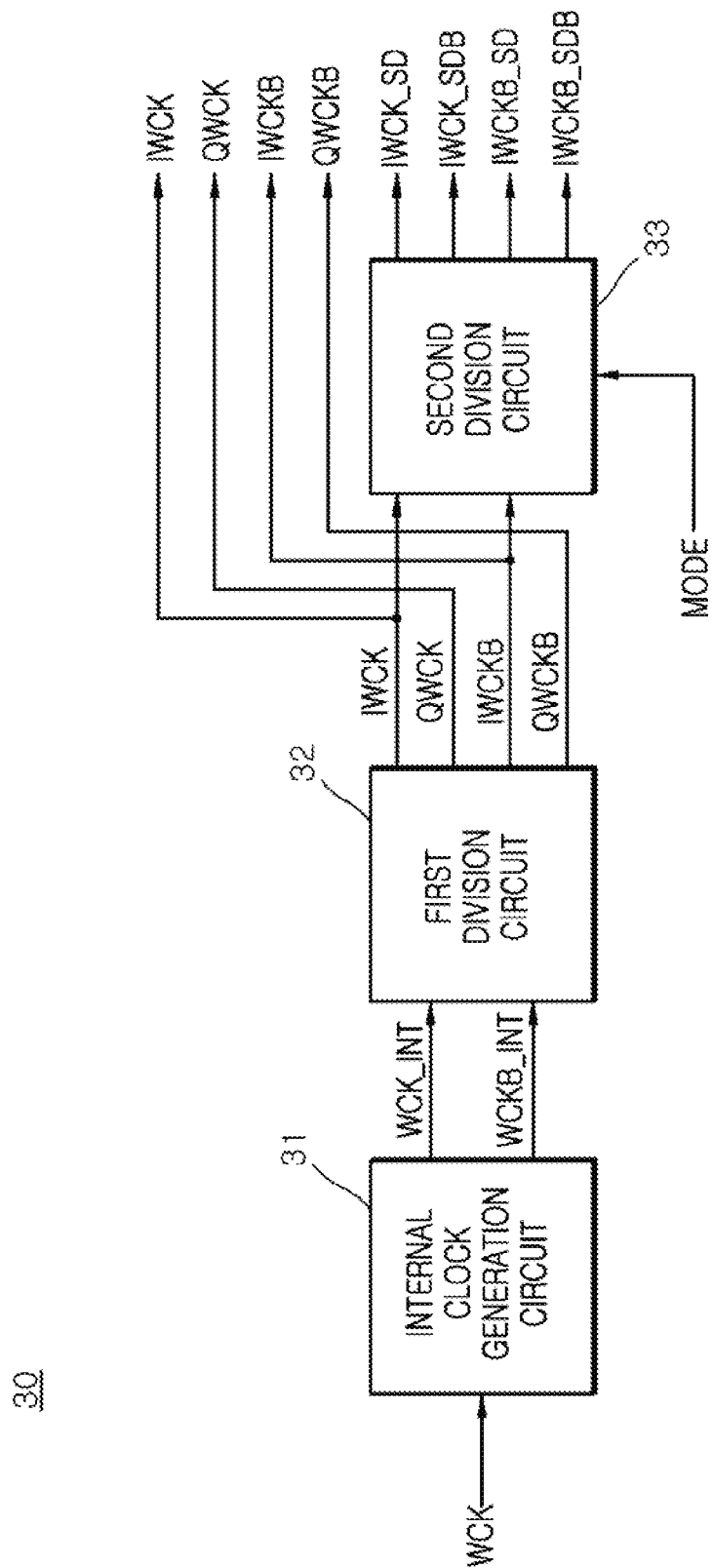
FIG. 4 is a block diagram illustrating a configuration of a frequency division circuit included in the semiconductor device of FIG. 1.

The frequency division circuit 30 may divide a frequency of a data clock signal WCK according to a logic level of a mode signal MODE to generate a first division clock signal (IWCK of FIG. 4), a second division clock signal (QWCK of FIG. 4), a third division clock signal (IWCKB of FIG. 4), and a fourth division clock signal (QWCKB of FIG. 4). The frequency division circuit 30 may divide a frequency of the data clock signal WCK according to a logic level of the mode signal MODE to generate a first internal division clock signal IWCK_SD, a second internal division clock signal (IWCK_SDB of FIG. 4), a third internal division clock signal IWCKB_SD, and a fourth internal division clock signal (IWCKB_SDB of FIG. 4). The frequency division circuit 30 may output the fourth division clock signal QWCKB, the first internal division clock signal IWCK_SD, and the third internal division clock signal IWCKB_SD. If the mode signal MODE has a logic "low" level, a first operation mode may be activated such that the first to fourth division clock signals IWCK, QWCK, IWCKB, and QWCKB are set to have the same frequency as the clock signal CLK. If the mode signal MODE has a logic "high" level, a second operation mode may be activated such that the first to fourth division clock signals IWCK, QWCK, IWCKB, and QWCKB are set to have a frequency which is twice a frequency of the clock signal CLK, and the first to fourth internal division clock signals IWCK_SD, IWCK_SDB, IWCKB_SD, and IWCKB_SDB are set to have the same frequency as the clock signal CLK.

The phase comparison circuit 40 may compare a phase of the phase detection clock signal PDCLK with phases of the fourth division clock signal QWCKB, the first internal division clock signal IWCK_SD, and the third internal division clock signal IWCKB_SD to generate a first phase difference detection signal PDIF<1> and a second phase difference detection signal PDIF<2>. In the first operation mode, the phase comparison circuit 40 may compare the phase of the phase detection clock signal PDCLK with the phase of the fourth division clock signal QWCKB to generate the first phase difference detection signal PDIF<1>. In the second operation mode, the phase comparison circuit 40 may compare the phase of the phase detection clock signal PDCLK with the phases of the fourth division clock signal QWCKB, the first internal division clock signal IWCK_SD, and the third internal division clock signal IWCKB_SD to generate the first phase difference detection signal PDIF<1> and the second phase difference detection signal PDIF<2>.

As described above, the phase difference detection circuit 1 may generate the first phase difference detection signal PDIF<1> and the second phase difference detection signal PDIF<2> by comparing the phase of the phase detection clock signal PDCLK generated from the first to seventh command/address signals CA<1:7> in synchronization with the clock signal CLK with the phases of the fourth division clock signal QWCKB, the first internal division clock signal IWCK_SD, and the third internal division clock signal IWCKB_SD that are generated by dividing a frequency of the data clock signal WCK according to the operation mode.

The internal circuit 2 may recognize the phases of the first to fourth division clock signals IWCK, QWCK, IWCKB, and QWCKB according to a logic level combination of the first phase difference detection signal PDIF<1> and the second phase difference detection signal PDIF<2>. The internal circuit 2 may recognize the phases of the first to fourth internal division clock signals IWCK_SD, IWCK-_SDB, IWCKB_SD, and IWCKB_SDB according to a logic level combination of the first phase difference detection signal PDIF<1> and the second phase difference detection signal PDIF<2>.

The internal circuit 2 may be realized using a memory circuit including a plurality of bank groups. The internal circuit 2 may receive the first to fourth division clock signals IWCK, QWCK, IWCKB, and QWCKB to perform a column operation. The internal circuit 2 may receive the first to fourth internal division clock signals IWCK_SD, IWCK-_SDB, IWCKB_SD, and IWCKB_SDB to perform a column operation. In the 8-bank mode, the internal circuit 2 may sequentially perform column operations for two banks respectively included in separate bank groups in response to one command, according to some embodiments. In the 16-bank mode, the internal circuit 2 may sequentially perform column operations for four banks respectively included in separate bank groups in response to one command, according to some embodiments.

A logic level combination of the first to seventh command/address signals CA<1:7> for generating the internal command CMP in the command generation circuit 10 is described with reference to FIG. 2.

The command generation circuit 10 may generate the internal command CMP from the first to seventh command/address signals CA<1:7> if the chip selection signal CS having a logic "high" level (indicated as "H") is inputted to the command generation circuit 10 in synchronization with a rising edge of the clock signal CLK. The logic level combination of the first to seventh command/address signals CA<1:7> for generating the internal command CMP may be set to correspond to a case that any one of the fifth to seventh command/address signals CA<5:7> has a logic "high" level while the first and second command/address signals CA<1:2> have a logic "low" level (indicated as "L") and the third and fourth command/address signals CA<3:4> have a logic "high" level. The fifth command/address signal CA<5> may be set as a signal for performing a first write operation WS_WR that synchronizes the division clock signals with the clock signal CLK. The first write operation WS_WR may be set as a write operation for storing external data into the semiconductor device 50. The sixth command/address signal CA<6> may be set as a signal for performing a read operation WS_RD that synchronizes the division clock signals with the clock signal CLK. The read operation WS_RD may be set as an operation for outputting the data stored in the semiconductor device 50 to an external device. The seventh command/address signal CA<7> may be set as a signal for performing a second write operation WS_FS that synchronizes the division clock signals with the clock signal CLK. The second write operation WS_FS may be set as a write operation for storing internal data or specific data having a specific pattern into the semiconductor device 50.

Figure 3:
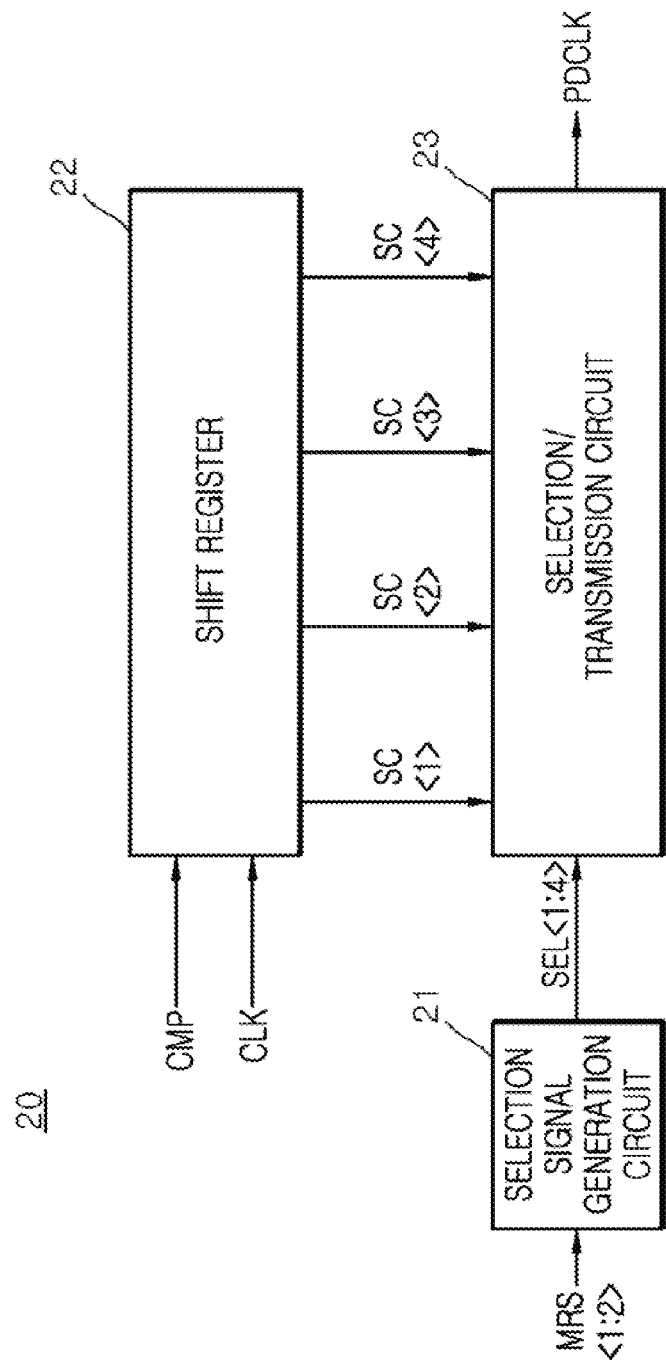
FIG. 3 is a block diagram illustrating a configuration of a phase detection clock generation circuit included in the semiconductor device of FIG. 1.

Referring to FIG. 3, the phase detection clock generation circuit 20 may include a selection signal generation circuit 21, a shift register 22, and a selection/transmission circuit 23.

The selection signal generation circuit 21 may generate first to fourth selection signals SEL<1:4>, one of which is selectively enabled according to a logic level combination of first and second mode register signals MRS<1:2>. The first and second mode register signals MRS<1:2> may be signals which are generated by a mode register set included in the semiconductor device 50. The first and second mode register signals MRS<1:2> may be signals for controlling a shift time of the internal command CMP. The number of bits included in the first and second mode register signals MRS<1:2> may be set to be different in different embodiments in order to differently adjust a shift time of the internal command CMP.

The shift register 22 may shift the internal command CMP in synchronization with the clock signal CLK to generate first to fourth shift commands SC<1:4> which are sequentially enabled. The shift register 22 may shift the internal command CMP in synchronization with the clock signal CLK to generate the first shift command SC<1>. The shift register 22 may shift the first shift command SC<1> in synchronization with the clock signal CLK to generate the second shift command SC<2>. The shift register 22 may shift the second shift command SC<2> in synchronization with the clock signal CLK to generate the third shift command SC<3>. The shift register 22 may shift the third shift command SC<3> in synchronization with the clock signal CLK to generate the fourth shift command SC<4>. Although FIG. 3 illustrates an example in which the shift register 22 generates the first to fourth shift commands SC<1:4>, the present disclosure is not limited thereto. That is, the number of shift commands generated by the shift register 22 may be different in different embodiments. For one embodiment, the shift register 22 shifts the internal command CMP by a period corresponding to a natural number "M" times a cycle of the clock CLK signal to generate first and second shift commands.

The selection/transmission circuit 23 may output any one of the first to fourth shift commands SC<1:4> as the phase detection clock signal PDCLK according to the first to fourth selection signals SEL<1:4>. The selection/transmission circuit 23 may output the first shift command SC<1> as the phase detection clock signal PDCLK if the first selection signal SEL<1> is enabled. The selection/transmission circuit 23 may output the second shift command SC<2> as the phase detection clock signal PDCLK if the second selection signal SEL<2> is enabled. The selection/transmission circuit 23 may output the third shift command SC<3> as the phase detection clock signal PDCLK if the third selection signal SEL<3> is enabled. The selection/transmission circuit 23 may output the fourth shift command SC<4> as the phase detection clock signal PDCLK if the fourth selection signal SEL<4> is enabled.

Referring to FIG. 4, the frequency division circuit 30 may include an internal clock generation circuit 31, a first division circuit 32, and a second division circuit 33.

The internal clock generation circuit 31 may amplify the data clock signal WCK provided by an external device to generate an internal clock signal WCK_INT and an inverted internal clock signal WCKB_INT. The internal clock generation circuit 31 may buffer the data clock signal WCK provided by an external device to generate the internal clock signal WCK_INT and the inverted internal clock signal WCKB_INT. The inverted internal clock signal WCKB_INT may be obtained by inverting the internal clock signal WCK_INT.

The first division circuit 32 may divide a frequency of the internal clock signal WCK_INT and the inverted internal clock signal WCKB_INT to generate the first to fourth division clock signals IWCK, QWCK, IWCKB, and QWCKB. The first division circuit 32 may generate the first to fourth division clock signals IWCK, QWCK, IWCKB, and QWCKB having a frequency which is half a frequency of the internal clock signal WCK_INT and the inverted internal clock signal WCKB_INT.

The second division circuit 33 may divide a frequency of the first division clock signal IWCK and the third division clock signal IWCKB to generate the first to fourth internal division clock signals IWCK_SD, IWCK_SDB, IWCKB_SD, and IWCKB_SDB, if the mode signal MODE is enabled. The second division circuit 33 may divide a frequency of the first division clock signal IWCK to generate the first and second internal division clock signals IWCK_SD and IWCK_SDB, if the mode signal MODE has a logic "high" level. The second division circuit 33 may divide a frequency of the third division clock signal IWCKB to generate the third and fourth internal division clock signals IWCKB_SD and IWCKB_SDB, if the mode signal MODE has a logic "high" level. The second division circuit 33 may inhibit the first to fourth internal division clock signals IWCK_SD, IWCK_SDB, IWCKB_SD, and IWCKB_SDB from being generated, if the mode signal MODE has a logic "low" level.

Figure 5:
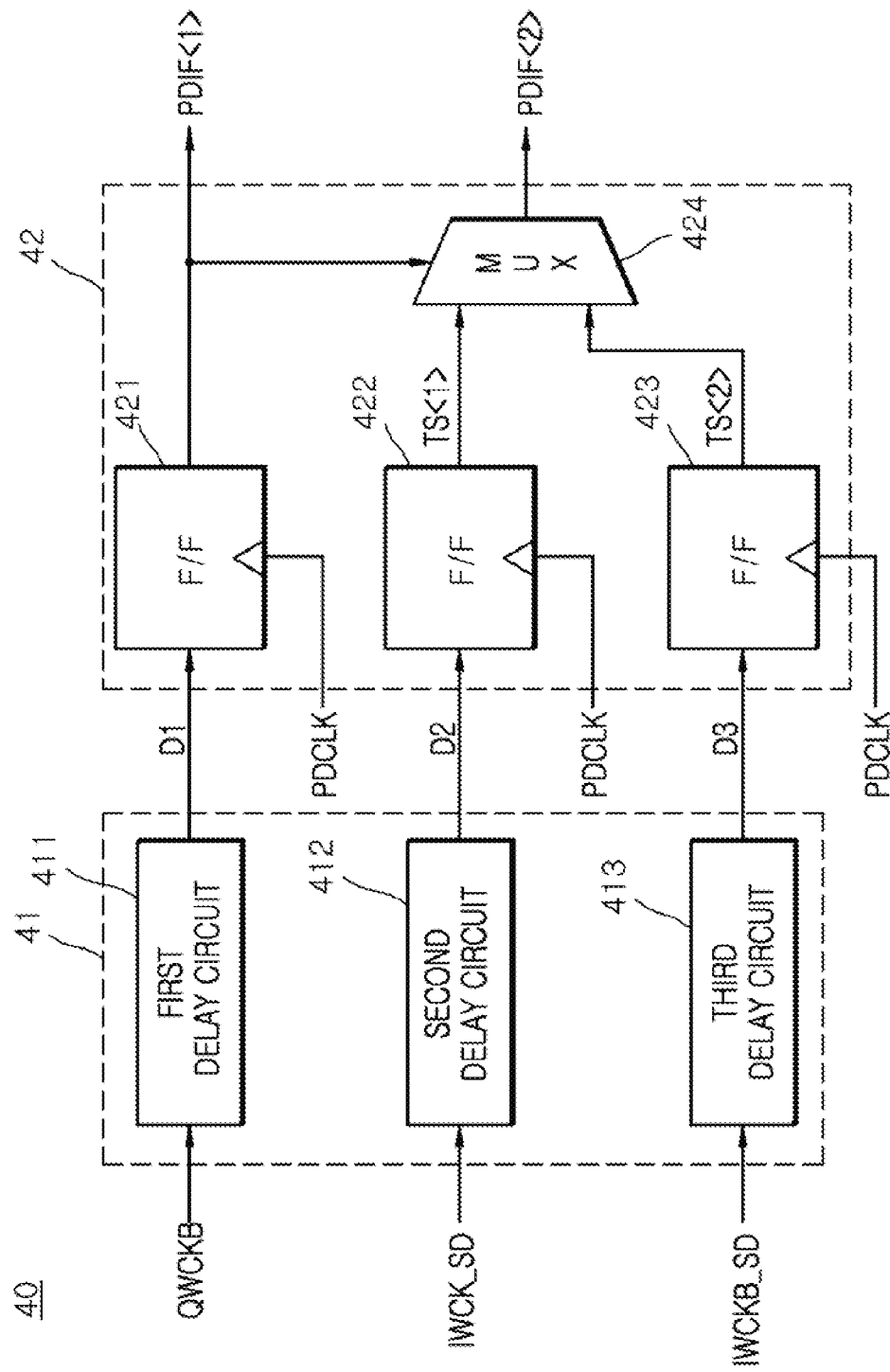
FIG. 5 is schematic view illustrating a configuration of a phase comparison circuit included in the semiconductor device of FIG. 1.

Referring to FIG. 5, the phase comparison circuit 40 may include a delay circuit 41 and a synchronization circuit 42.

The delay circuit 41 may include a first delay circuit 411, a second delay circuit 412, and a third delay circuit 413. The first delay circuit 411 may delay the fourth division clock signal QWCKB to generate a first delayed signal D1. The second delay circuit 412 may delay the first internal division clock signal IWCK_SD to generate a second delayed signal D2. The third delay circuit 413 may delay the third internal division clock signal IWCKB_SD to generate a third delayed signal D3. Delay times of the first to third delay circuits 411, 412, and 413 may be set to be equal. The first to third delay circuits 411, 412, and 413 may be realized using inverter chains or R-C delay circuits.

As described above, the delay circuit 41 may delay the fourth division clock signal QWCKB to generate the first delayed signal D1, may delay the first internal division clock signal IWCK_SD to generate the second delayed signal D2, and may delay the third internal division clock signal IWCKB_SD to generate the third delayed signal D3.

The synchronization circuit 42 may include a first latch circuit 421, a second latch circuit 422, a third latch circuit 423, and a multiplexer 424.

The first latch circuit 421 may be realized using a flip-flip.

The first latch circuit 421 may latch the first delayed signal D1 in synchronization with a rising edge of the phase detection clock signal PDCLK to generate the first phase difference detection signal PDIF<1>.

The second latch circuit 422 may be realized using a flip-flip. The second latch circuit 422 may latch the second delayed signal D2 in synchronization with a rising edge of the phase detection clock signal PDCLK to generate a first transmission signal TS<1>.

The third latch circuit 423 may be realized using a flip-flip. The third latch circuit 423 may latch the third delayed signal D3 in synchronization with a rising edge of the phase detection clock signal PDCLK to generate a second transmission signal TS<2>.

The multiplexer 424 may output the first transmission signal TS<1> as the second phase difference detection signal PDIF<2> if the first phase difference detection signal PDIF<1> has a first logic level (e.g., a logic "low" level). The multiplexer 424 may output the second transmission signal TS<2> as the second phase difference detection signal PDIF<2> if the first phase difference detection signal PDIF<1> has a second logic level (e.g., a logic "high" level).

As described above, the synchronization circuit 42 may latch the first delayed signal D1 in synchronization with the phase detection clock signal PDCLK to generate the first phase difference detection signal PDIF<1> and may latch the second and third delayed signals D2 and D3 in synchronization with the phase detection clock signal PDCLK to generate the second phase difference detection signal PDIF<2>.

An operation of comparing a phase of the phase detection clock signal PDCLK with a phase of the fourth division clock signal QWCKB to generate the first phase difference detection signal PDIF<1> in the first operation mode is described below with reference to FIGS. 6 and 7.

In advance of the description of the operation for generating the first phase difference detection signal PDIF<1>, frequencies and phases of the data clock signal WCK, an inverted data clock signal WCKB, the first division clock signal IWCK, the second division clock signal QWCK, the third division clock signal IWCKB, and the fourth division clock signal QWCKB are described.

The data clock signal WCK and the inverted data clock signal WCKB may have a frequency which is twice a frequency of the clock signal CLK. The inverted data clock signal WCKB may have a phase which is opposite to a phase of the data clock signal WCK. For an embodiment, two signals having opposite phases means the signals having a phase difference of 180 degrees.

The first division clock signal IWCK, the second division clock signal QWCK, the third division clock signal IWCKB, and the fourth division clock signal QWCKB may be generated to have the same frequency as the clock signal CLK and may be generated to have a frequency which is half a frequency of the data clock signal WCK and the inverted data clock signal WCKB. The first division clock signal IWCK, the second division clock signal QWCK, the third division clock signal IWCKB, and the fourth division clock signal QWCKB may be generated to have phase differences of 90 degrees, respectively. For example, the first division clock signal IWCK and the second division clock signal QWCK have a phase difference of 90 degrees, the second division clock signal QWCK and the third division clock signal IWCKB have a phase difference of 90 degrees, and the third division clock signal IWCKB and the fourth division clock signal QWCKB have a phase difference of 90 degrees. In an embodiment, the phase differences are such that the first division clock signal IWCK leads the second division clock signal QWCK, the second division clock signal QWCK leads the third division clock signal IWCKB, and the third division clock signal IWCKB leads the fourth division clock signal QWCKB. See, for example, FIGS. 6 through 11.

Figure 6:
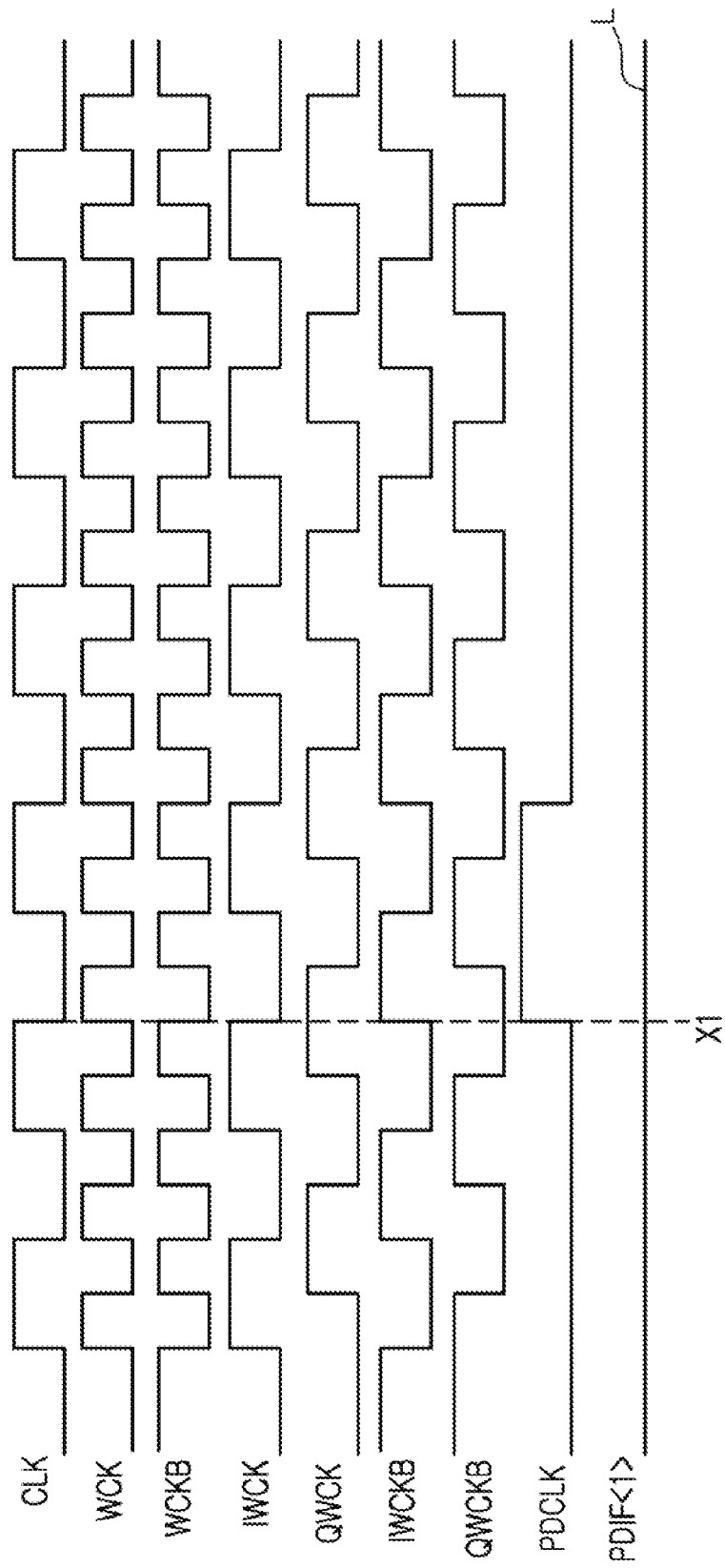
FIGS. 6 and 7 are timing diagrams illustrating a first operation mode of a semiconductor device according to an embodiment of the present disclosure.

Referring to FIG. 6, at a time "X1," the phase comparison circuit 40 may generate the first phase difference detection signal PDIF<1> having a logic "low(L)" level because the fourth division clock signal QWCKB has a logic "low" level at a rising edge of the phase detection clock signal PDCLK, which is synchronized with a falling edge of the clock signal CLK.

The internal circuit 2 may regard phases of the first division clock signal IWCK, the second division clock signal QWCK, the third division clock signal IWCKB, and the fourth division clock signal QWCKB as normal phases if the first phase difference detection signal PDIF<1> has a logic "low(L)" level in the first operation mode. The normal phases of the first division clock signal IWCK, the second division clock signal QWCK, the third division clock signal IWCKB, and the fourth division clock signal QWCKB may mean phases of the first to fourth division clock signals IWCK, QWCK, IWCKB, and QWCKB that are normally synchronized with the clock signal CLK.

Figure 7:
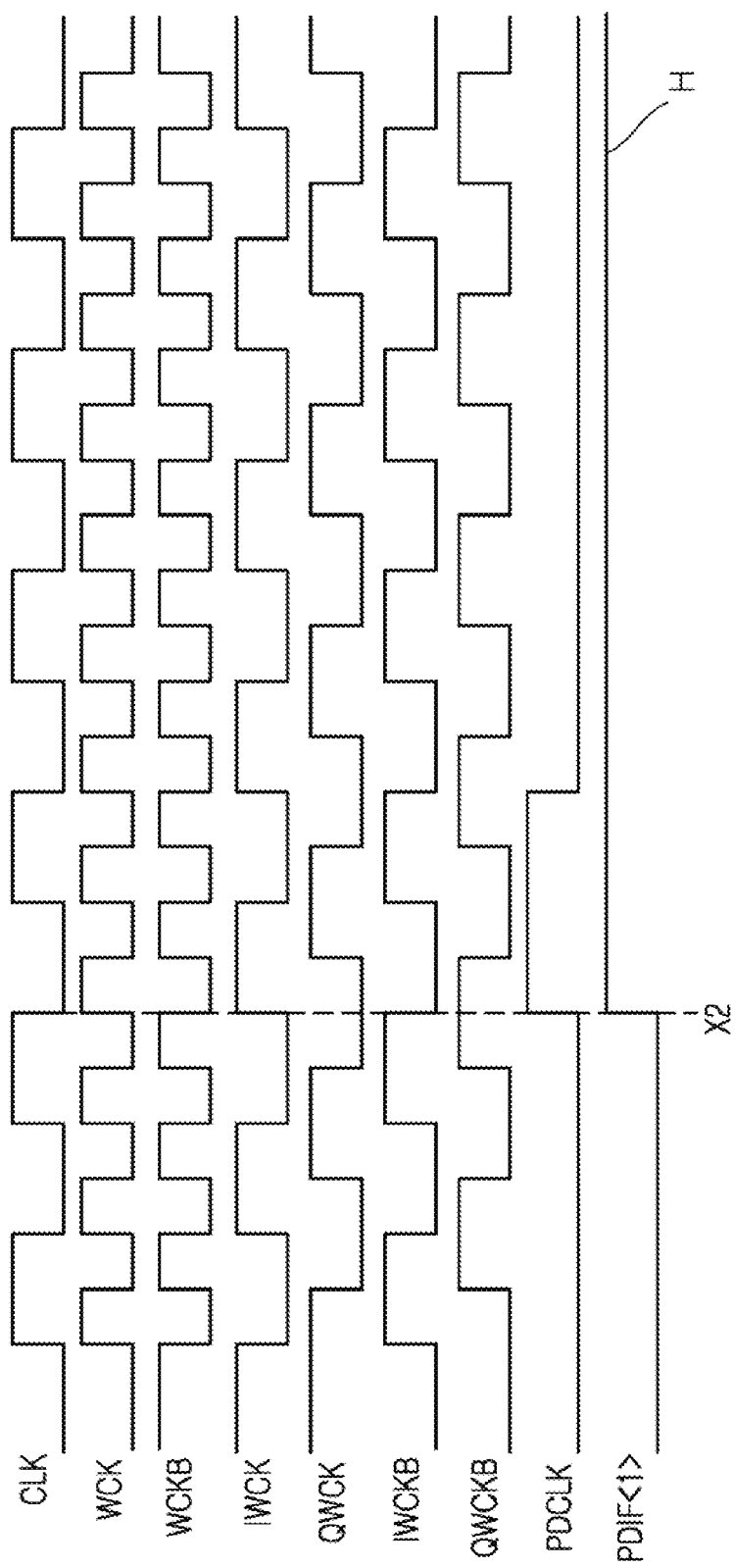

Referring to FIG. 7, at a time "X2," the phase comparison circuit 40 may generate the first phase difference detection signal PDIF<1> having a logic "high(H)" level because the fourth division clock signal QWCKB has a logic "high" level at a rising edge of the phase detection clock signal PDCLK, which is synchronized with a falling edge of the clock signal CLK.

The internal circuit 2 may regard phases of the first division clock signal IWCK, the second division clock signal QWCK, the third division clock signal IWCKB, and the fourth division clock signal QWCKB as opposite phases if the first phase difference detection signal PDIF<1> has a logic "high(H)" level in the first operation mode. The opposite phases of the first division clock signal IWCK, the second division clock signal QWCK, the third division clock signal IWCKB, and the fourth division clock signal QWCKB may mean phases of the first to fourth division clock signals IWCK, QWCK, IWCKB, and QWCKB that are abnormally synchronized with the clock signal CLK.

An operation of comparing a phase of the phase detection clock signal PDCLK with phases of the fourth division clock signal QWCKB, the first internal division clock signal IWCK_SD, and the third internal division clock signal IWCKB_SD to generate the first and second phase difference detection signals PDIF<1:2> in the second operation mode is described below with reference to FIGS. 8 to 11.

In advance of the description of the operation for generating the first and second phase difference detection signals PDIF<1:2>, the frequencies and the phases of the data clock signal WCK, the inverted data clock signal WCKB, the first to fourth division clock signals IWCK, QWCK, IWCKB, and QWCKB, the first internal division clock signal IWCK_SD, and the third internal division clock signal IWCKB_SD are described.

The data clock signal WCK and the inverted data clock signal WCKB may have a frequency which is four times a frequency of the clock signal CLK. The inverted data clock signal WCKB may have a phase which is opposite to a phase of the data clock signal WCK.

The first division clock signal IWCK, the second division clock signal QWCK, the third division clock signal IWCKB, and the fourth division clock signal QWCKB may be generated to have a frequency which is twice a frequency of the clock signal CLK and may be generated to have a frequency which is half a frequency of the data clock signal WCK and the inverted data clock signal WCKB. The first division clock signal IWCK, the second division clock signal QWCK, the third division clock signal IWCKB, and the fourth division clock signal QWCKB may be generated to have phase differences of 90 degrees, respectively. For example, the first division clock signal IWCK and the second division clock signal QWCK have a phase difference of 90 degrees, the second division clock signal QWCK and the third division clock signal IWCKB have a phase difference of 90 degrees, and the third division clock signal IWCKB and the fourth division clock signal QWCKB have a phase difference of 90 degrees. In an embodiment, the phase differences are such that the first division clock signal IWCK leads the second division clock signal QWCK, the second division clock signal QWCK leads the third division clock signal IWCKB, and the third division clock signal IWCKB leads the fourth division clock signal QWCKB. See, for example, FIGS. 6 through 11. The first and third internal division clock signals IWCK_SD and IWCKB_SD may be generated to have a frequency which is half a frequency of the first to fourth division clock signals IWCK, QWCK, IWCKB, and QWCKB and may be generated to have the same frequency as the clock signal CLK.

Figure 8:
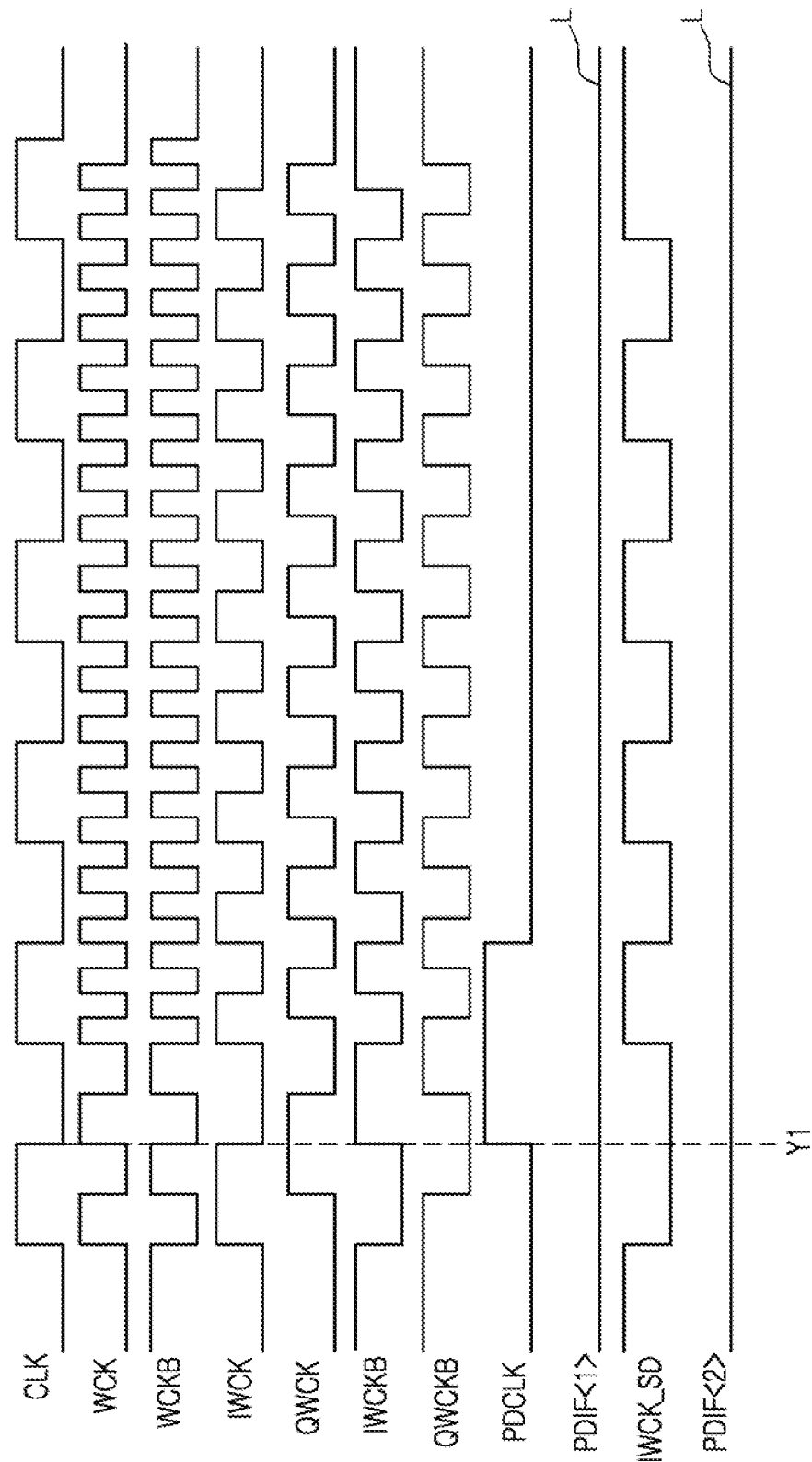
FIGS. 8 to 11 are timing diagrams illustrating a second operation mode of a semiconductor device according to an embodiment of the present disclosure.

Referring to FIG. 8, at a time "Y1," the phase comparison circuit 40 may generate the first phase difference detection signal PDIF<1> having a logic "low(L)" level because the fourth division clock signal QWCKB has a logic "low" level at a rising edge of the phase detection clock signal PDCLK, which is synchronized with a falling edge of the clock signal CLK. The phase comparison circuit 40 may generate the second phase difference detection signal PDIF<2> having a logic "low(L)" level because the first internal division clock signal IWCK_SD has a logic "low" level at a rising edge of the phase detection clock signal PDCLK, which is synchronized with a falling edge of the clock signal CLK.

The internal circuit 2 may regard the phases of the first division clock signal IWCK, the second division clock signal QWCK, the third division clock signal IWCKB, and the fourth division clock signal QWCKB as the normal phases if the first phase difference detection signal PDIF<1> has a logic "low(L)" level in the second operation mode.

The internal circuit 2 may regard the phases of the first internal division clock signal IWCK_SD, the second internal division clock signal IWCK_SDB, the third internal division clock signal IWCKB_SD, and the fourth internal division clock signal IWCKB_SDB as the normal phases if the second phase difference detection signal PDIF<2> has a logic "low(L)" level in the second operation mode.

Figure 9:
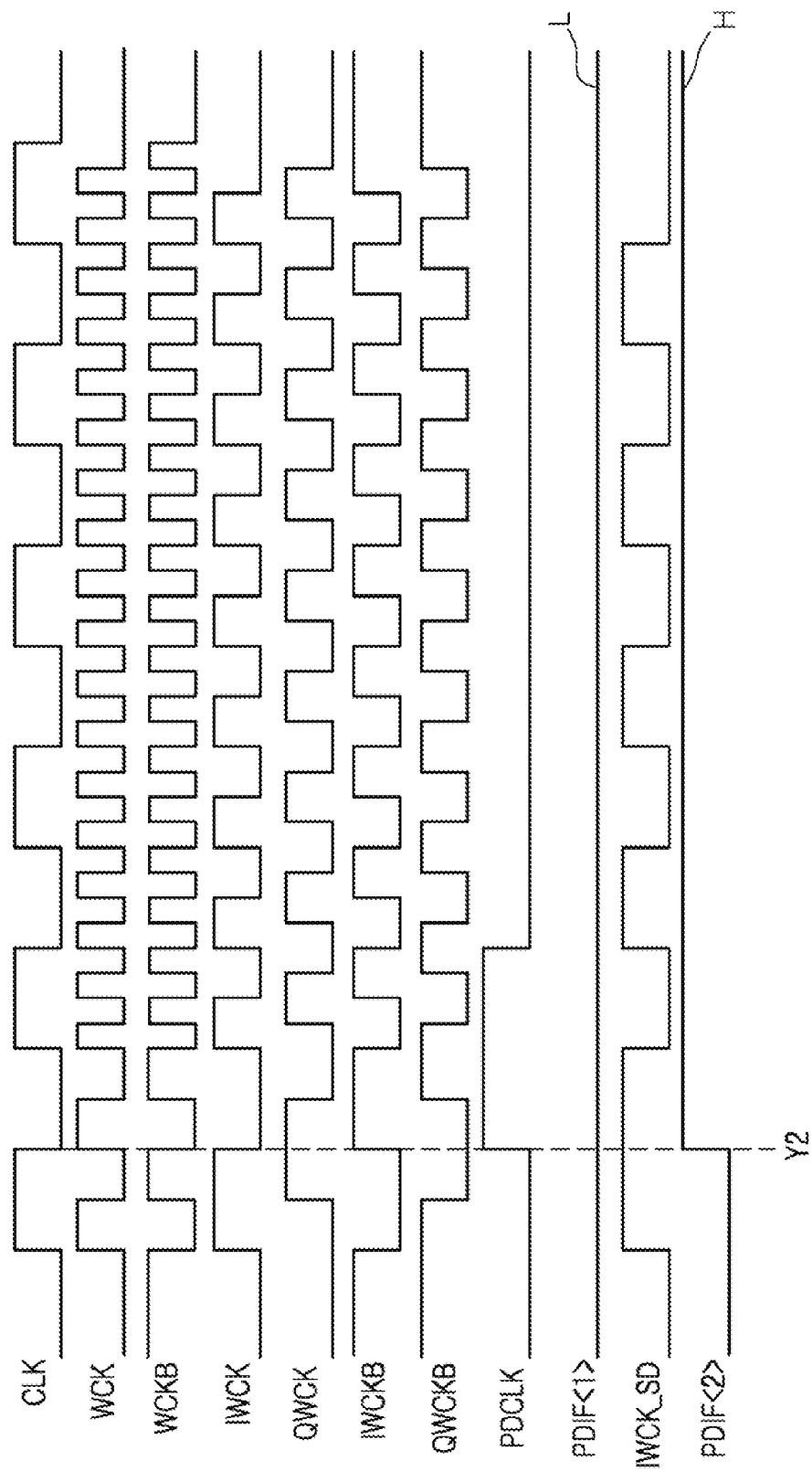

Referring to FIG. 9, at a time "Y2," the phase comparison circuit 40 may generate the first phase difference detection signal PDIF<1> having a logic "low(L)" level because the fourth division clock signal QWCKB has a logic "low" level at a rising edge of the phase detection clock signal PDCLK, which is synchronized with a falling edge of the clock signal CLK. The phase comparison circuit 40 may generate the second phase difference detection signal PDIF<2> having a logic "high(H)" level because the first internal division clock signal IWCK_SD has a logic "high" level at a rising edge of the phase detection clock signal PDCLK, which is synchronized with a falling edge of the clock signal CLK.

The internal circuit 2 may regard the phases of the first division clock signal IWCK, the second division clock signal QWCK, the third division clock signal IWCKB, and the fourth division clock signal QWCKB as the normal phases if the first phase difference detection signal PDIF<1> has a logic "low(L)" level in the second operation mode.

The internal circuit 2 may regard the phases of the first internal division clock signal IWCK_SD, the second internal division clock signal IWCK_SDB, the third internal division clock signal IWCKB_SD, and the fourth internal division clock signal IWCKB_SDB as the opposite phases if the second phase difference detection signal PDIF<2> has a logic "high(H)" level in the second operation mode.

Figure 10:
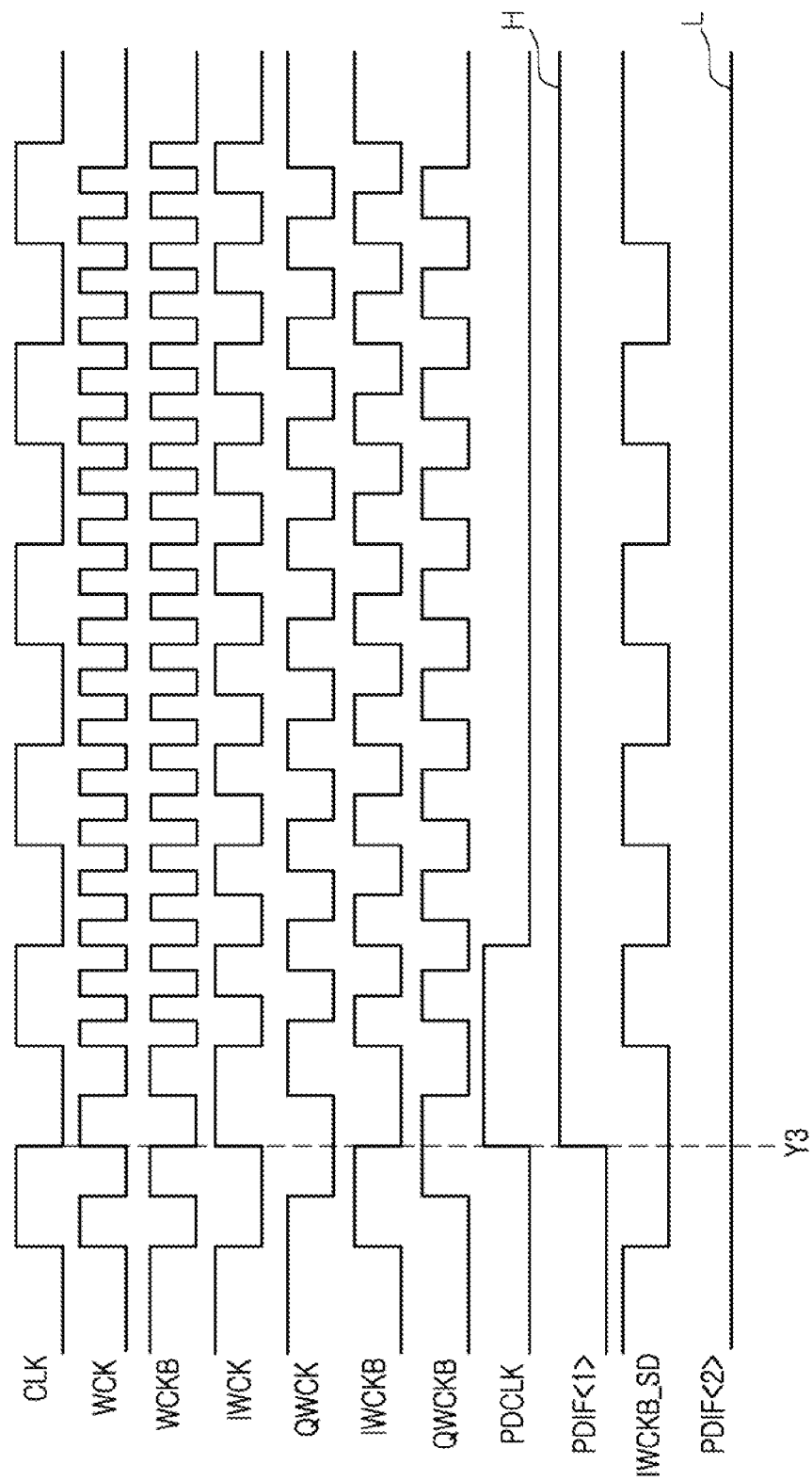

Referring to FIG. 10, at a time "Y3," the phase comparison circuit 40 may generate the first phase difference detection signal PDIF<1> having a logic "high(H)" level because the fourth division clock signal QWCKB has a logic "high" level at a rising edge of the phase detection clock signal PDCLK, which is synchronized with a falling edge of the clock signal CLK. The phase comparison circuit 40 may generate the second phase difference detection signal PDIF<2> having a logic "low(L)" level because the third internal division clock signal IWCKB_SD has a logic "low" level at a rising edge of the phase detection clock signal PDCLK, which is synchronized with a falling edge of the clock signal CLK.

The internal circuit 2 may regard the phases of the first division clock signal IWCK, the second division clock signal QWCK, the third division clock signal IWCKB, and the fourth division clock signal QWCKB as the opposite phases if the first phase difference detection signal PDIF<1> has a logic "high(H)" level in the second operation mode.

The internal circuit 2 may regard the phases of the first internal division clock signal IWCK_SD, the second internal division clock signal IWCK_SDB, the third internal division clock signal IWCKB_SD, and the fourth internal division clock signal IWCKB_SDB as the normal phases if the second phase difference detection signal PDIF<2> has a logic "low(L)" level in the second operation mode.

Figure 11:
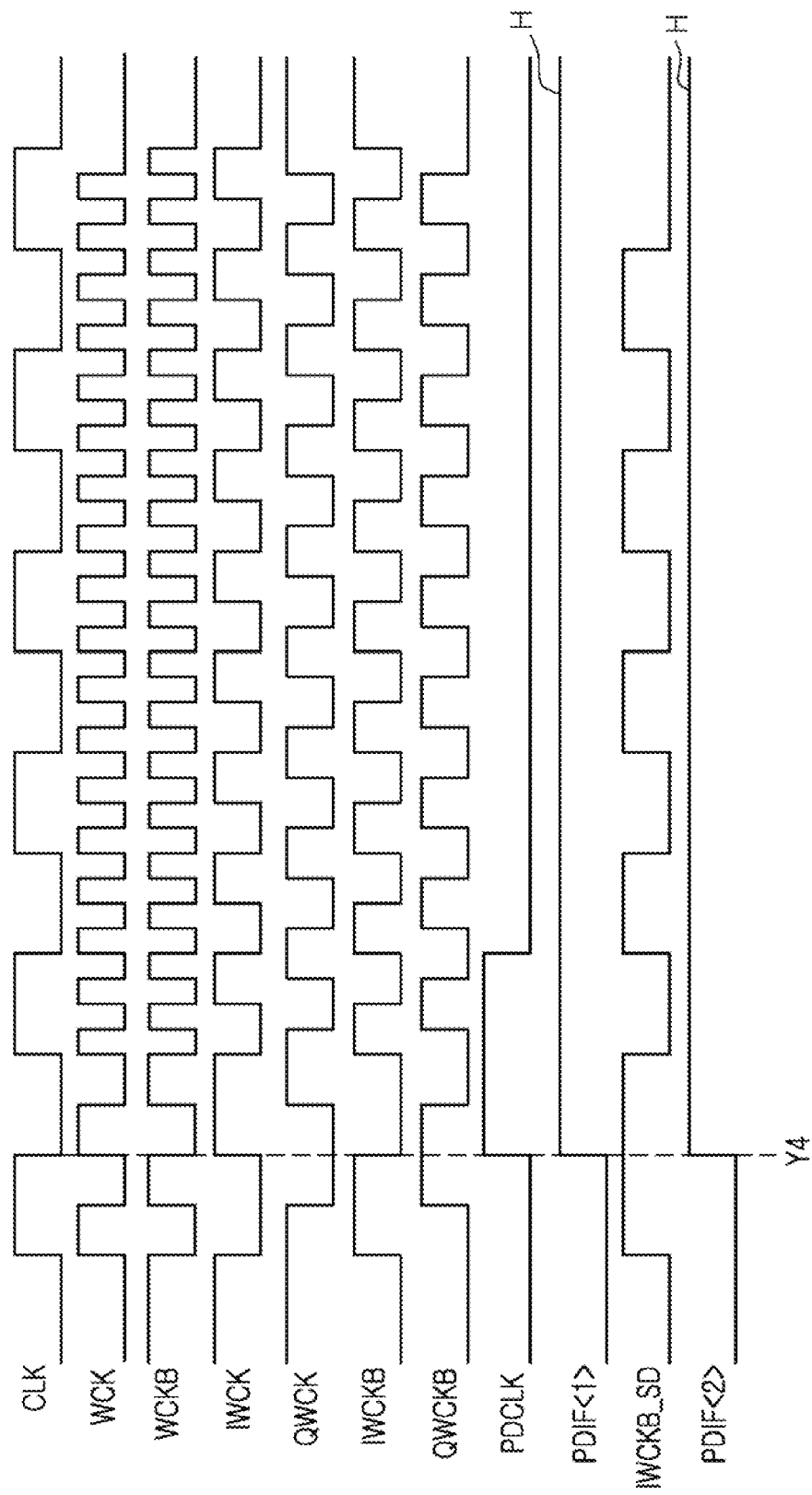

Referring to FIG. 11, at a time "Y4," the phase comparison circuit 40 may generate the first phase difference detection signal PDIF<1> having a logic "high(H)" level because the fourth division clock signal QWCKB has a logic "high" level at a rising edge of the phase detection clock signal PDCLK, which is synchronized with a falling edge of the clock signal CLK. The phase comparison circuit 40 may generate the second phase difference detection signal PDIF<2> having a logic "high(H)" level because the third internal division clock signal IWCKB_SD has a logic "high" level at a rising edge of the phase detection clock signal PDCLK, which is synchronized with a falling edge of the clock signal CLK.

The internal circuit 2 may regard the phases of the first division clock signal IWCK, the second division clock signal QWCK, the third division clock signal IWCKB, and the fourth division clock signal QWCKB as the opposite phases if the first phase difference detection signal PDIF<1> has a logic "high(H)" level in the second operation mode.

The internal circuit 2 may regard the phases of the first internal division clock signal IWCK_SD, the second internal division clock signal IWCK_SDB, the third internal division clock signal IWCKB_SD, and the fourth internal division clock signal IWCKB_SDB as the opposite phases if the second phase difference detection signal PDIF<2> has a logic "high(H)" level in the second operation mode.

As described above, the semiconductor device according 50 to an embodiment may recognize the phases of the division clock signals and the internal division clock signals which are generated by dividing a frequency of the data clock signal in the first operation mode and in the second operation mode.

Figure 12:
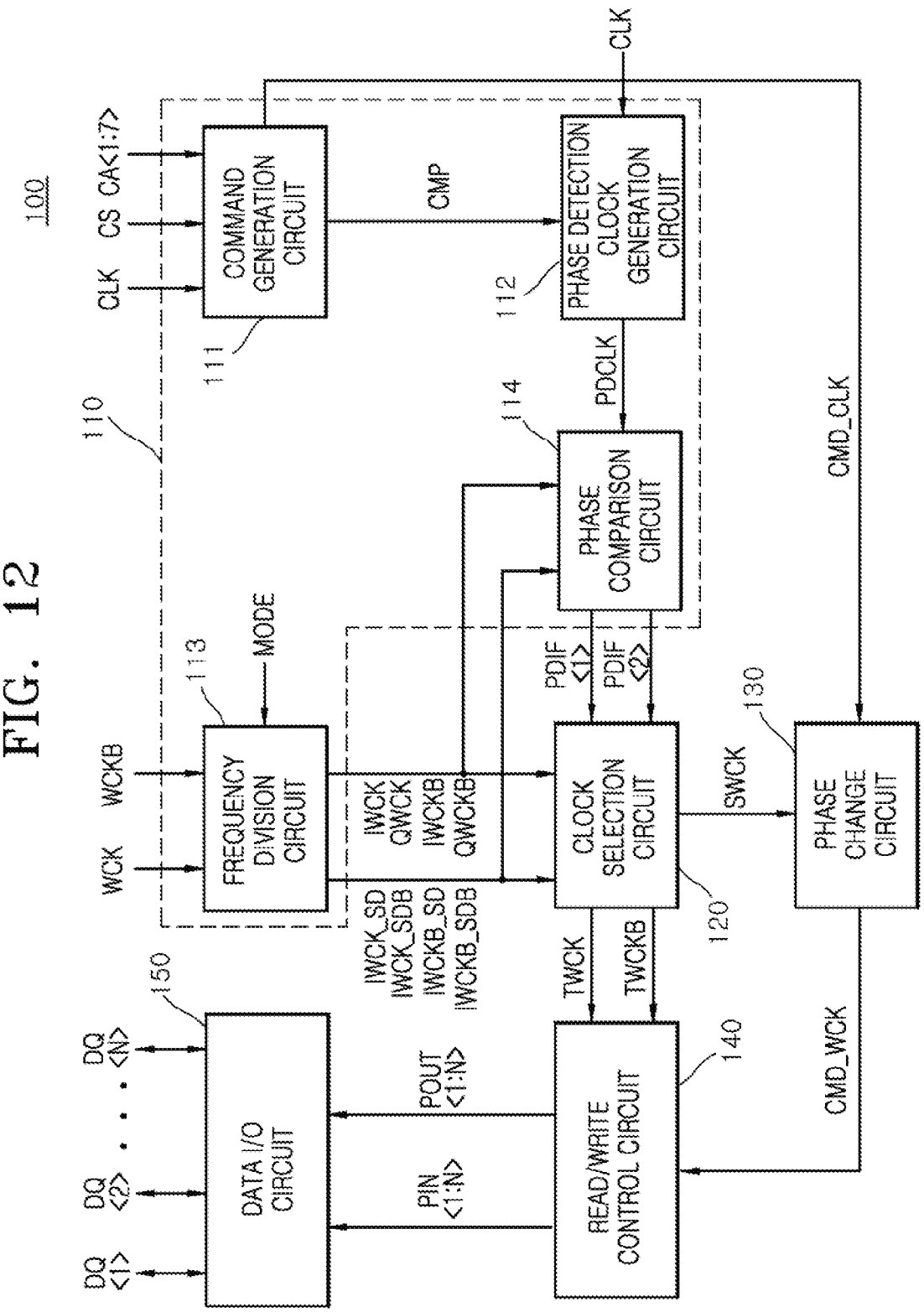
FIG. 12 is a block diagram illustrating a configuration of a semiconductor device according to another embodiment of the present disclosure.

As illustrated in FIG. 12, a semiconductor device 100, according to another embodiment of the present teachings, may include a phase difference detection circuit 110, a clock selection circuit 120, a phase change circuit 130, a read/write control circuit 140, and a data I/O circuit 150.

The phase difference detection circuit 110 may include a command generation circuit 111, a phase detection clock generation circuit 112, a frequency division circuit 113, and a phase comparison circuit 114.

The command generation circuit 111 may be synchronized with a clock signal CLK to generate an internal command CMP from a chip selection signal CS and first to seventh command/address signals CA<1:7>. The command generation circuit 111 may be synchronized with the clock signal CLK to receive the chip selection signal CS and may generate the internal command CMP including a pulse which is created if the first to seventh command/address signals CA<1:7> have a predetermined logic level combination. The command generation circuit 111 may generate a command pulse CMD_CLK for performing a read operation or a write operation according to a logic level combination of the first to seventh command/address signals CA<1:7> if the chip selection signal CS is inputted to the command generation circuit 111. Although the command pulse CMD_CLK is illustrated as a single signal for performing a specific operation of the semiconductor device 100 in FIG. 12, the command pulse CMD_CLK may be set as one of various signals. For example, the command pulse CMD_CLK may be set as a pulse for the read operation or the write operation. The number of bits included in the command/address signals may be different for different embodiments. Because the predetermined logic level combination of the first to seventh command/address signals CA<1:7> for generating the internal command CMP is illustrated in FIG. 2, a detailed description of the predetermined logic level combination of the first to seventh command/address signals CA<1:7> for generating the internal command CMP is not repeated here.

The phase detection clock generation circuit 112 may be synchronized with the internal command CMP to generate a phase detection clock signal PDCLK which is enabled during a predetermined period. The phase detection clock generation circuit 112 may generate the phase detection clock signal PDCLK having the same phase as the clock signal CLK if the pulse of the internal command CMP is created. The phase detection clock generation circuit 112 may shift the internal command CMP to generate the phase detection clock signal PDCLK. A shift time of the internal command CMP may be set differently in different embodiments. The phase detection clock generation circuit 112 may be realized using the same circuit as the phase detection clock generation circuit 20 illustrated in FIG. 3. Thus, a detailed description of the phase detection clock generation circuit 112 is not repeated here.

The frequency division circuit 113 may divide a frequency of a data clock signal WCK and an inverted data clock signal WCKB according to a logic level of a mode signal MODE to generate a first division clock signal IWCK, a second division clock signal QWCK, a third division clock signal IWCKB, and a fourth division clock signal QWCKB. The frequency division circuit 113 may divide a frequency of the data clock signal WCK and the inverted data clock signal WCKB to generate the first to fourth division clock signals IWCK, QWCK, IWCKB, and QWCKB and may divide the first and third division clock signals IWCK and IWCKB to generate a first internal division clock signal IWCK_SD, a second internal division clock signal IWCK_SDB, a third internal division clock signal IWCKB_SD, and a fourth internal division clock signal IWCKB_SDB, according to a logic level of the mode signal MODE. The mode signal MODE may have a logic "low" level to activate a first operation mode in which the first to fourth division clock signals IWCK, QWCK, IWCKB, and QWCKB are set to have the same frequency as the clock signal CLK. The mode signal MODE may have a logic "high" level to activate a second operation mode in which the first to fourth division clock signals IWCK, QWCK, IWCKB, and QWCKB are set to have a frequency which is twice a frequency of the clock signal CLK, and the first to fourth internal division clock signals IWCK_SD, IWCK_SDB, IWCKB_SD, and IWCKB_SDB are set to have the same frequency as the clock signal CLK. The data clock signal WCK and the inverted data clock signal WCKB may be provided by an external device for some embodiments or may be generated in the semiconductor device 100 for other embodiments. The frequency division circuit 113 may be realized using substantially the same circuit as the frequency division circuit 30 illustrated in FIG. 4. Thus, a detailed description of the frequency division circuit 113 is not repeated here.

The phase comparison circuit 114 may compare a phase of the phase detection clock signal PDCLK with phases of the fourth division clock signal QWCKB, the first internal division clock signal IWCK_SD, and the third internal division clock signal IWCKB_SD to generate a first phase difference detection signal PDIF<1> and a second phase difference detection signal PDIF<2>. In the first operation mode, the phase comparison circuit 114 may compare the phase of the phase detection clock signal PDCLK with the phase of the fourth division clock signal QWCKB to generate the first phase difference detection signal PDIF<1>. In the second operation mode, the phase comparison circuit 114 may compare the phase of the phase detection clock signal PDCLK with the phases of the fourth division clock signal QWCKB, the first internal division clock signal IWCK_SD, and the third internal division clock signal IWCKB_SD to generate the first phase difference detection signal PDIF<1> and the second phase difference detection signal PDIF<2>. The phase comparison circuit 114 may be realized using substantially the same circuit as the phase comparison circuit 40 illustrated in FIG. 5. Thus, a detailed description of the phase comparison circuit 114 is not repeated here.

As described above, the phase difference detection circuit 110 may generate the first phase difference detection signal PDIF<1> and the second phase difference detection signal PDIF<2> by comparing the phase of the phase detection clock signal PDCLK generated from the first to seventh command/address signals CA<1:7> in synchronization with the clock signal CLK with the phases of the fourth division clock signal QWCKB, the first internal division clock signal IWCK_SD, and the third internal division clock signal IWCKB_SD that are generated by dividing a frequency of the data clock signal WCK according to the operation mode.

The clock selection circuit 120 may output any one of the first to fourth division clock signals IWCK, QWCK, IWCKB, and QWCKB and the first to fourth internal division clock signals IWCK_SD, IWCK_SDB, IWCKB_SD, and IWCKB_SDB as a selection clock signal SWCK according to a logic level combination of the first phase difference detection signal PDIF<1> and the second phase difference detection signal PDIF<2>. An operation of the clock selection circuit 120 outputting any one of the first to fourth division clock signals IWCK, QWCK, IWCKB, and QWCKB and the first to fourth internal division clock signals IWCK_SD, IWCK_SDB, IWCKB_SD, and IWCKB_SDB as the selection clock signal SWCK according to a logic level combination of the first and second phase difference detection signals PDIF<1> and PDIF<2> is described in detail with reference to FIG. 13 below.

The clock selection circuit 120 may select a signal having a correct phase among the first to fourth division clock signals IWCK, QWCK, IWCKB, and QWCKB and the first to fourth internal division clock signals IWCK_SD, IWCK_SDB, IWCKB_SD, and IWCKB_SDB according to a logic level combination of the first and second phase difference detection signals PDIF<1> and PDIF<2> and may respectively output the selected signal and an inverted signal of the selected signal as a transmission clock signal TWCK and an inverted transmission clock signal TWCKB. If the first division clock signal IWCK has a normal phase, the signal having the correct phase may correspond to the first division clock signal IWCK and the first division clock signal IWCK may be outputted as the transmission clock signal TWCK. If the first division clock signal IWCK has an opposite phase, the third division clock signal IWCKB may be outputted as the transmission clock signal TWCK. If the second division clock signal QWCK has the normal phase, the first or third internal division clock signal IWCK_SD or IWCKB_SD may be outputted as the transmission clock signal TWCK. If the second division clock signal QWCK has the opposite phase, the second or fourth internal division clock signal IWCK_SDB or IWCKB_SDB may be outputted as the transmission clock signal TWCK. The way of selecting any one of the first to fourth division clock signals IWCK, QWCK, IWCKB, and QWCKB and the first to fourth internal division clock signals IWCK_SD, IWCK_SDB, IWCKB_SD, and IWCKB_SDB to generate the transmission clock signal TWCK may be different for different embodiments.

The phase change circuit 130 may be synchronized with the selection clock signal SWCK to output the command pulse CMD_CLK synchronized with the clock signal CLK as a phase change command pulse CMD_WCK. The phase change circuit 130 may perform a domain crossing operation that changes a phase of the command pulse CMD_CLK having the same phase as the clock signal CLK into a phase of the selection clock signal SWCK to generate the phase change command pulse CMD_WCK.

The read/write control circuit 140 may generate a pipe input signal PIN<1:N> and a pipe output signal POUT<1:N>, which are used for performing the write operation and the read operation, from the phase change command pulse CMD_WCK. The read/write control circuit 140 may be realized to generate various signals, which are used for performing the write operation and the read operation, from the transmission clock signal TWCK and the inverted transmission clock signal TWCKB in synchronization with the phase change command pulse CMD_WCK according to the embodiments.

The data I/O circuit 150 may receive or output data DQ<1:N> according to the pipe input signal PIN<1:N> and the pipe output signal POUT<1:N>. The data I/O circuit 150 may receive the data DQ<1:N> to store the data DQ<1:N> into a memory circuit (not shown) during the write operation according to the pipe input signal PIN<1:N> and the pipe output signal POUT<1:N>. The data I/O circuit 150 may output the data DQ<1:N> stored in the memory circuit during the read operation according to the pipe input signal PIN<1:N> and the pipe output signal POUT<1:N>.

The division clock signals outputted as the selection clock signal SWCK according to various logic level combinations of the first and second phase difference detection signals PDIF<1:2> in the first and second operation modes are described with reference to FIG. 13. In FIG. 13, "X" means a "DON'T CARE STATE."

If the first phase difference detection signal PDIF<1> has a logic "low" level in the first operation mode, the first division clock signal IWCK may be outputted as the selection clock signal SWCK. In such a case, the phases of the first to fourth division clock signals IWCK, QWCK, IWCKB, and QWCKB may be regarded as normal phases.

If the first phase difference detection signal PDIF<1> has a logic "high" level in the first operation mode, the third division clock signal IWCKB may be outputted as the selection clock signal SWCK. In such a case, the phases of the first to fourth division clock signals IWCK, QWCK, IWCKB, and QWCKB may be regarded as opposite phases.

If the first phase difference detection signal PDIF<1> has a logic "low" level and the second phase difference detection signal PDIF<2> has a logic "low" level in the second operation mode, the first internal division clock signal IWCK_SD may be outputted as the selection clock signal SWCK. In such a case, the phases of the first to fourth division clock signals IWCK, QWCK, IWCKB, and QWCKB may be regarded as the normal phases, and the phases of the first to fourth internal division clock signals IWCK_SD, IWCK_SDB, IWCKB_SD, and IWCKB_SDB may be regarded as the normal phases.

If the first phase difference detection signal PDIF<1> has a logic "low" level and the second phase difference detection signal PDIF<2> has a logic "high" level in the second operation mode, the second internal division clock signal IWCK_SDB may be outputted as the selection clock signal SWCK. In such a case, the phases of the first to fourth division clock signals IWCK, QWCK, IWCKB, and QWCKB may be regarded as the normal phases, and the phases of the first to fourth internal division clock signals IWCK_SD, IWCK_SDB, IWCKB_SD, and IWCKB_SDB may be regarded as the opposite phases.

If the first phase difference detection signal PDIF<1> has a logic "high" level and the second phase difference detection signal PDIF<2> has a logic "low" level in the second operation mode, the third internal division clock signal IWCKB_SD may be outputted as the selection clock signal SWCK. In such a case, the phases of the first to fourth division clock signals IWCK, QWCK, IWCKB, and QWCKB may be regarded as the opposite phases, and the phases of the first to fourth internal division clock signals IWCK_SD, IWCK_SDB, IWCKB_SD, and IWCKB_SDB may be regarded as the normal phases.

If the first phase difference detection signal PDIF<1> has a logic "high" level and the second phase difference detection signal PDIF<2> has a logic "high" level in the second operation mode, the fourth internal division clock signal IWCKB_SDB may be outputted as the selection clock signal SWCK. In such a case, the phases of the first to fourth division clock signals IWCK, QWCK, IWCKB, and QWCKB may be regarded as the opposite phases, and the phases of the first to fourth internal division clock signals IWCK_SD, IWCK_SDB, IWCKB_SD, and IWCKB_SDB may be regarded as the opposite phases.

As described above, the semiconductor device 100, according to an embodiment, may recognize the phases of the division clock signals and the internal division clock signals which are generated by dividing a frequency of the data clock signal in the first operation mode and in the second operation mode. In addition, the semiconductor device 100 may perform a write operation and a read operation by performing a domain crossing operation that changes a phase of the command pulse having the same phase as the clock signal into a phase of the selection clock signal in the first operation mode and in the second operation mode.

Figure 14:
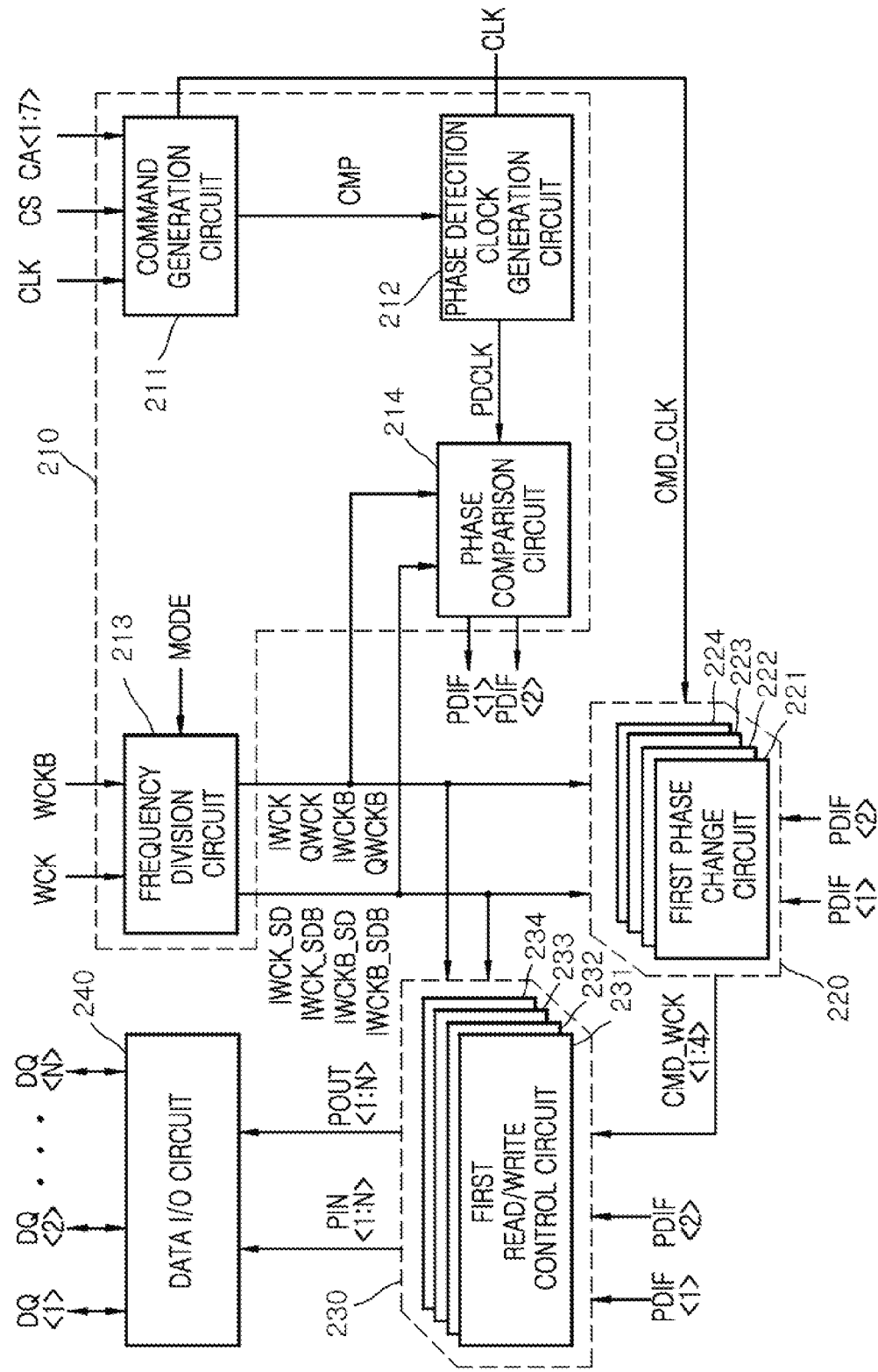
FIGS. 14 and 15 are block diagrams illustrating configurations of semiconductor devices according to other embodiments of the present disclosure.

As illustrated in FIG. 14, a semiconductor device 200 according to yet another embodiment may include a phase difference detection circuit 210, a phase change circuit 220, a read/write control circuit 230, and a data I/O circuit 240.

The phase difference detection circuit 210 may include a command generation circuit 211, a phase detection clock generation circuit 212, a frequency division circuit 213, and a phase comparison circuit 214.

The command generation circuit 211 may be synchronized with a clock signal CLK to generate an internal command CMP from a chip selection signal CS and first to seventh command/address signals CA<1:7>. The command generation circuit 211 may generate a command pulse CMD_CLK having the same phase as the clock signal CLK if the internal command CMP is generated. The command generation circuit 211 may be realized using substantially the same circuit as the command generation circuit 111 illustrated in FIG. 12. Thus, a detailed description of the command generation circuit 211 is not repeated here.

The phase detection clock generation circuit 212 may be synchronized with the internal command CMP to generate a phase detection clock signal PDCLK which is enabled during a predetermined period. The phase detection clock generation circuit 212 may be realized using the same circuit as the phase detection clock generation circuit 112 illustrated in FIG. 12. Thus, a detailed description of the phase detection clock generation circuit 212 is not repeated here.

The frequency division circuit 213 may divide a frequency of a data clock signal WCK and an inverted data clock signal WCKB according to a logic level of a mode signal MODE to generate a first division clock signal IWCK, a second division clock signal QWCK, a third division clock signal IWCKB, and a fourth division clock signal QWCKB. The frequency division circuit 213 may divide a frequency of the data clock signal WCK and the inverted data clock signal WCKB to generate the first to fourth division clock signals IWCK, QWCK, IWCKB, and QWCKB and may divide the first and third division clock signals IWCK and IWCKB to generate a first internal division clock signal IWCK_SD, a second internal division clock signal IWCK_SDB, a third internal division clock signal IWCKB_SD, and a fourth internal division clock signal IWCKB_SDB, according to a logic level of the mode signal MODE. The frequency division circuit 213 may be realized using substantially the same circuit as the frequency division circuit 113 illustrated in FIG. 12. Thus, a detailed description of the frequency division circuit 213 is not repeated here.

The phase comparison circuit 214 may compare a phase of the phase detection clock signal PDCLK with phases of the fourth division clock signal QWCKB, the first internal division clock signal IWCK_SD, and the third internal division clock signal IWCKB_SD to generate a first phase difference detection signal PDIF<1> and a second phase difference detection signal PDIF<2>. The phase comparison circuit 214 may be realized using substantially the same circuit as the phase comparison circuit 114 illustrated in FIG. 12. Thus, a detailed description of the phase comparison circuit 214 is not repeated here.

As described above, the phase difference detection circuit 210 may generate the first phase difference detection signal PDIF<1> and the second phase difference detection signal PDIF<2> by comparing the phase of the phase detection clock signal PDCLK generated from the first to seventh command/address signals CA<1:7> in synchronization with the clock signal CLK with the phases of the fourth division clock signal QWCKB, the first internal division clock signal IWCK_SD, and the third internal division clock signal IWCKB_SD that are generated by dividing a frequency of the data clock signal WCK according to the operation mode.

The phase change circuit 220 may include a first phase change circuit 221, a second phase change circuit 222, a third phase change circuit 223, and a fourth phase change circuit 224.

The first phase change circuit 221 may be synchronized with the first division clock signal IWCK to output the command pulse CMD_CLK as a first phase change command pulse CMD_WCK<1> if the first phase difference detection signal PDIF<1> has a logic "low" level in the first operation mode. The first phase change circuit 221 may be synchronized with the first internal division clock signal IWCK_SD to output the command pulse CMD_CLK as the first phase change command pulse CMD_WCK<1> if the first phase difference detection signal PDIF<1> has a logic "low" level and the second phase difference detection signal PDIF<2> has a logic "low" level in the second operation mode. The first phase change circuit 221 may perform a domain crossing operation that changes a phase of the command pulse CMD_CLK having the same phase as the clock signal CLK into a phase of the first division clock signal IWCK or the first internal division clock signal IWCK_SD to generate the first phase change command pulse CMD_WCK<1>.

The second phase change circuit 222 may be synchronized with the first division clock signal IWCK to output the command pulse CMD_CLK as a second phase change command pulse CMD_WCK<2> if the first phase difference detection signal PDIF<1> has a logic "low" level in the first operation mode. The second phase change circuit 222 may be synchronized with the second internal division clock signal IWCK_SDB to output the command pulse CMD_CLK as the second phase change command pulse CMD_WCK<2> if the first phase difference detection signal PDIF<1> has a logic "low" level and the second phase difference detection signal PDIF<2> has a logic "high" level in the second operation mode. The second phase change circuit 222 may perform the domain crossing operation that changes a phase of the command pulse CMD_CLK having the same phase as the clock signal CLK into a phase of the first division clock signal IWCK or the second internal division clock signal IWCK_SDB to generate the second phase change command pulse CMD_WCK<2>.

The third phase change circuit 223 may be synchronized with the third division clock signal IWCKB to output the command pulse CMD_CLK as a third phase change command pulse CMD_WCK<3> if the first phase difference detection signal PDIF<1> has a logic "high" level in the first operation mode. The third phase change circuit 223 may be synchronized with the third internal division clock signal IWCKB_SD to output the command pulse CMD_CLK as the third phase change command pulse CMD_WCK<3> if the first phase difference detection signal PDIF<1> has a logic "high" level and the second phase difference detection signal PDIF<2> has a logic "low" level in the second operation mode. The third phase change circuit 223 may perform the domain crossing operation that changes a phase of the command pulse CMD_CLK having the same phase as the clock signal CLK into a phase of the third division clock signal IWCKB or the third internal division clock signal IWCKB_SD to generate the third phase change command pulse CMD_WCK<3>.

The fourth phase change circuit 224 may be synchronized with the third division clock signal IWCKB to output the command pulse CMD_CLK as a fourth phase change command pulse CMD_WCK<4> if the first phase difference detection signal PDIF<1> has a logic "high" level in the first operation mode. The fourth phase change circuit 224 may be synchronized with the fourth internal division clock signal IWCKB_SDB to output the command pulse CMD_CLK as the fourth phase change command pulse CMD_WCK<4> if the first phase difference detection signal PDIF<1> has a logic "high" level and the second phase difference detection signal PDIF<2> has a logic "high" level in the second operation mode. The fourth phase change circuit 224 may perform the domain crossing operation that changes a phase of the command pulse CMD_CLK having the same phase as the clock signal CLK into a phase of the third division clock signal IWCKB or the fourth internal division clock signal IWCKB_SDB to generate the fourth phase change command pulse CMD_WCK<4>.

The read/write control circuit 230 may include a first read/write control circuit 231, a second read/write control circuit 232, a third read/write control circuit 233, and a fourth read/write control circuit 234.

The first read/write control circuit 231 may be synchronized with the first phase change command pulse CMD_WCK<1> to generate a pipe input signal PIN<1:N> and a pipe output signal POUT<1:N>, which are used for performing a write operation and a read operation, if the first phase difference detection signal PDIF<1> has a logic "low" level in the first operation mode. In another embodiment, the first read/write control circuit 231 may be synchronized with the first division clock signal IWCK to generate the pipe input signal PIN<1:N> and the pipe output signal POUT<1:N>, which are used for performing the write operation and the read operation, if the first phase difference detection signal PDIF<1> has a logic "low" level in the first operation mode. The first read/write control circuit 231 may be synchronized with the first phase change command pulse CMD_WCK<1> to generate the pipe input signal PIN<1:N> and the pipe output signal POUT<1:N>, which are used for performing the write operation and the read operation, if the first phase difference detection signal PDIF<1> has a logic "low" level and the second phase difference detection signal PDIF<2> has a logic "low" level in the second operation mode. In another embodiment, the first read/write control circuit 231 may be synchronized with the first division clock signal IWCK to generate the pipe input signal PIN<1:N> and the pipe output signal POUT<1:N>, which are used for performing the write operation and the read operation, if the first phase difference detection signal PDIF<1> has a logic "low" level and the second phase difference detection signal PDIF<2> has a logic "low" level in the second operation mode.

The second read/write control circuit 232 may be synchronized with the second phase change command pulse CMD_WCK<2> to generate the pipe input signal PIN<1:N> and the pipe output signal POUT<1:N>, which are used for performing the write operation and the read operation, if the first phase difference detection signal PDIF<1> has a logic "low" level in the first operation mode. In another embodiment, the second read/write control circuit 232 may be synchronized with the first division clock signal IWCK to generate the pipe input signal PIN<1:N> and the pipe output signal POUT<1:N>, which are used for performing the write operation and the read operation, if the first phase difference detection signal PDIF<1> has a logic "low" level in the first operation mode. The second read/write control circuit 232 may be synchronized with the second phase change command pulse CMD_WCK<2> to generate the pipe input signal PIN<1:N> and the pipe output signal POUT<1:N>, which are used for performing the write operation and the read operation, if the first phase difference detection signal PDIF<1> has a logic "low" level and the second phase difference detection signal PDIF<2> has a logic "high" level in the second operation mode. In another embodiment, the second read/write control circuit 232 may be synchronized with the first division clock signal IWCK to generate the pipe input signal PIN<1:N> and the pipe output signal POUT<1:N>, which are used for performing the write operation and the read operation, if the first phase difference detection signal PDIF<1> has a logic "low" level and the second phase difference detection signal PDIF<2> has a logic "high" level in the second operation mode.

The third read/write control circuit 233 may be synchronized with the third phase change command pulse CMD_WCK<3> to generate the pipe input signal PIN<1:N> and the pipe output signal POUT<1:N>, which are used for performing the write operation and the read operation, if the first phase difference detection signal PDIF<1> has a logic "high" level in the first operation mode. In another embodiment, the third read/write control circuit 233 may be synchronized with the third division clock signal IWCKB to generate the pipe input signal PIN<1:N> and the pipe output signal POUT<1:N>, which are used for performing the write operation and the read operation, if the first phase difference detection signal PDIF<1> has a logic "high" level in the first operation mode. The third read/write control circuit 233 may be synchronized with the third phase change command pulse CMD_WCK<3> to generate the pipe input signal PIN<1:N> and the pipe output signal POUT<1:N>, which are used for performing the write operation and the read operation, if the first phase difference detection signal PDIF<1> has a logic "high" level and the second phase difference detection signal PDIF<2> has a logic "low" level in the second operation mode. In another embodiment, the third read/write control circuit 233 may be synchronized with the third division clock signal IWCKB to generate the pipe input signal PIN<1:N> and the pipe output signal POUT<1:N>, which are used for performing the write operation and the read operation, if the first phase difference detection signal PDIF<1> has a logic "high" level and the second phase difference detection signal PDIF<2> has a logic "low" level in the second operation mode.

The fourth read/write control circuit 234 may be synchronized with the fourth phase change command pulse CMD_WCK<4> to generate the pipe input signal PIN<1:N> and the pipe output signal POUT<1:N>, which are used for performing the write operation and the read operation, if the first phase difference detection signal PDIF<1> has a logic "high" level in the first operation mode. In another embodiment, the fourth read/write control circuit 234 may be synchronized with the third division clock signal IWCKB to generate the pipe input signal PIN<1:N> and the pipe output signal POUT<1:N>, which are used for performing the write operation and the read operation, if the first phase difference detection signal PDIF<1> has a logic "high" level in the first operation mode. The fourth read/write control circuit 234 may be synchronized with the fourth phase change command pulse CMD_WCK<4> to generate the pipe input signal PIN<1:N> and the pipe output signal POUT<1:N>, which are used for performing the write operation and the read operation, if the first phase difference detection signal PDIF<1> has a logic "high" level and the second phase difference detection signal PDIF<2> has a logic "high" level in the second operation mode. In another embodiment, the fourth read/write control circuit 234 may be synchronized with the third division clock signal IWCKB to generate the pipe input signal PIN<1:N> and the pipe output signal POUT<1:N>, which are used for performing the write operation and the read operation, if the first phase difference detection signal PDIF<1> has a logic "high" level and the second phase difference detection signal PDIF<2> has a logic "high" level in the second operation mode.

The data I/O circuit 240 may receive or output data DQ<1:N> according to the pipe input signal PIN<1:N> and the pipe output signal POUT<1:N>. The data I/O circuit 240 may be realized using substantially the same circuit as the data I/O circuit 150 illustrated in FIG. 12. Thus, a detailed description of the data I/O circuit 240 is not repeated here.

As described above, the semiconductor device 200 according to another embodiment may recognize the phases of the division clock signals and the internal division clock signals which are generated by dividing a frequency of the data clock signal in the first operation mode and in the second operation mode. In addition, the semiconductor device 200 may perform a write operation and a read operation by performing a domain crossing operation that changes a phase of the command pulse having the same phase as the clock signal into a phase of the selection clock signal in the first operation mode and in the second operation mode.

Figure 15:
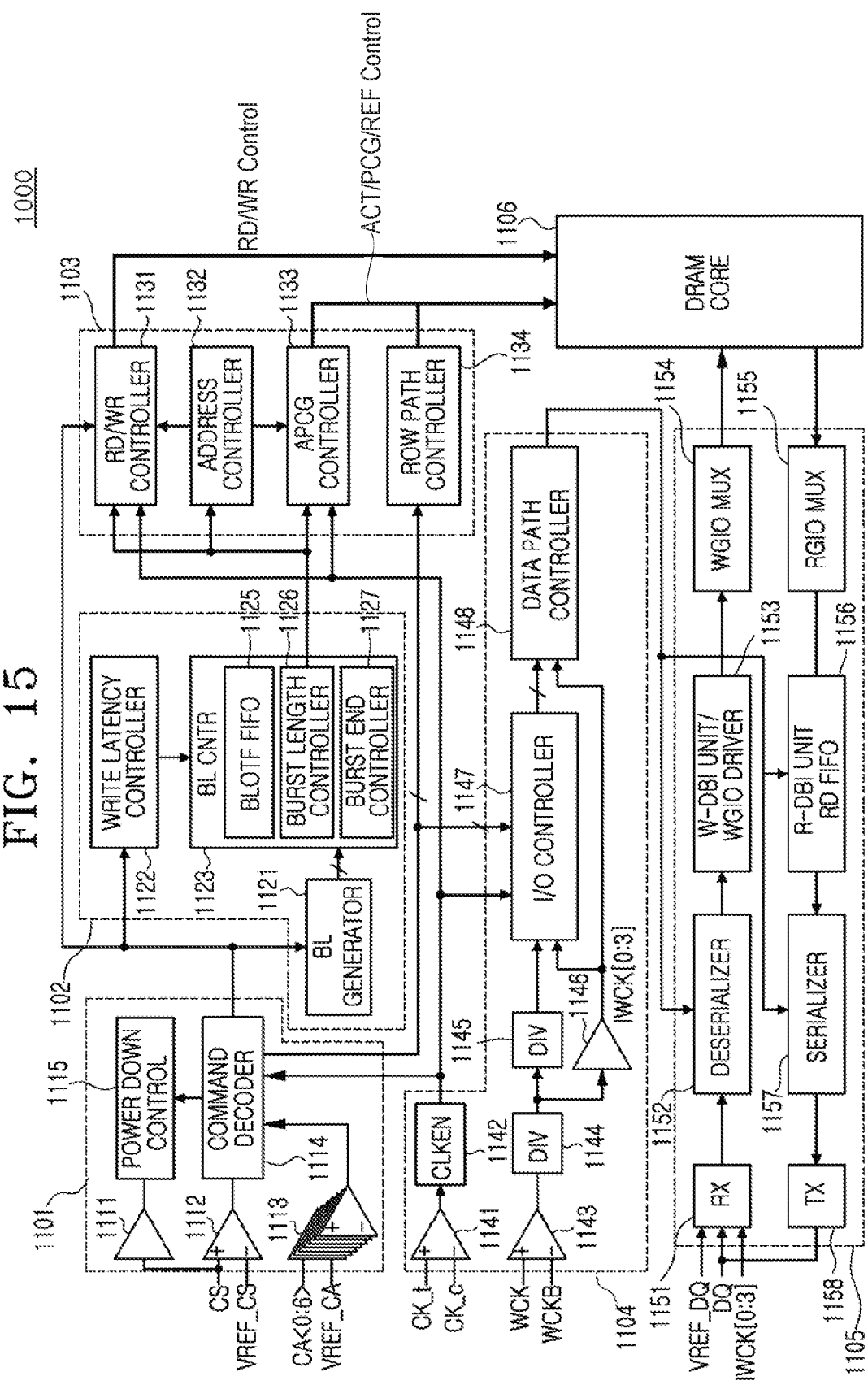

Referring to FIG. 15, a semiconductor device 1000 according to still another embodiment may include a command control circuit 1101, a latency/burst control circuit 1102, an operation control circuit 1103, an input/output (I/O) control circuit 1104, a data I/O circuit 1105, and a DRAM core 1106.

The command control circuit 1101 may include an input drive circuit 1111, a chip selection signal buffer 1112, a command/address buffer 1113, a command decoder 1114, and a power-down control circuit 1115. The input drive circuit 1111 may receive and drive a chip selection signal CS to transmit the chip selection signal CS to the power-down control circuit 1115. The chip selection signal buffer 1112 may buffer the chip selection signal CS based on a chip selection reference voltage VREF_CS. The command/address buffer 1113 may buffer a command/address signal CA<0:6> based on a command/address reference voltage VREF_CA. The command decoder 1114 may decode the command/address signal CA<0:6> buffered by the command/address buffer 1113 based on the chip selection signal CS buffered by the chip selection signal buffer 1112 to generate various commands used for the operation of the semiconductor device 1000. The power-down control circuit 1115 may control a power-down mode based on the chip selection signal CS driven by the input drive circuit 1111 and a command generated by the command decoder 1114.

The latency/burst control circuit 1102 may include a burst length information generator 1121, a write latency controller 1122, and a burst length control circuit 1123. The burst length information generator 1121 may generate information used for control of a burst length operation based on a command generated by the command decoder 1114. The write latency controller 1122 may perform a control operation according to a write latency based on a command generated by the command decoder 1114. The burst length control circuit 1123 may include an information storage circuit 1125 storing information outputted from the burst length information generator 1121. The burst length control circuit 1123 may include a burst length controller 1126 for controlling the burst length operation based on a command generated by the command decoder 1114, a signal outputted from the write latency controller 1122, and information outputted from the burst length information generator 1121. The burst length control circuit 1123 may include a burst end controller 1127 for controlling a burst end operation based on a command generated by the command decoder 1114, a signal outputted from the write latency controller 1122, and information outputted from the burst length information generator 1121.

The operation control circuit 1103 may include a read/write controller 1131, an address controller 1132, an auto-pre-charge controller 1133, and a row path controller 1134 to generate a read/write control signal RD/WR_Control for controlling a read operation and a write operation as well as a row path control signal ACT/PCG/REF_Control for controlling an active operation, a pre-charge operation, and a refresh operation. The read/write controller 1131 may control the read operation and the write operation based on a signal outputted from the latency/burst control circuit 1102 and a signal outputted from the address controller 1132 if clock signals CK_t and CK_c are activated. The address controller 1132 may control generation of an address based on a signal outputted from the latency/burst control circuit 1102. The auto-pre-charge controller 1133 may control an auto-pre-charge operation based on a signal outputted from the latency/burst control circuit 1102 if the clock signals CK_t and CK_c are activated. The row path controller 1134 may control a row path based on a command generated by the command decoder 1114.

The I/O control circuit 1104 may include a first clock buffer 1141, a clock enablement signal generator 1142, a second clock buffer 1143, a first divider 1144, a second divider 1145, an internal clock driver 1146, an I/O controller 1147, and a data path controller 1148. The first clock buffer 1141 may receive and buffer the clock signals CK_t and CK_c. The clock enablement signal generator 1142 may generate a clock enablement signal after the clock signals CK_t and CK_c buffered by the first clock buffer 241 are activated. The second clock buffer 1143 may receive and buffer data clock signals WCK and WCKB for input and output of the data. The first divider 1144 may divide the data clock signals WCK and WCKB buffered by the second clock buffer 1143. The second divider 1145 may receive and divide an output signal of the first divider 1144. The internal clock driver 1146 may receive and divide an output signal of the first divider 1144 to generate an internal data clock signal IWCK[0:3]. The I/O controller 1147 may receive a signal divided by the second divider 1145 and the internal data clock signal IWCK[0:3] generated by the internal clock driver 1146 to control the input and output of the data. The data path controller 1148 may control a data path used in the input and output of the data, based on a signal outputted from the I/O controller 1147 and the internal data clock signal IWCK[0:3] generated by the internal clock driver 1146. The I/O control circuit 1104 may have substantially the same function as any one of the semiconductor devices described with reference to FIGS. 1 to 14 except I/O signals thereof. That is, the I/O control circuit 1104 may be replaced with any one of the semiconductor devices described with reference to FIGS. 1 to 14 to perform a domain crossing operation. As a result, the I/O control circuit 1104 may control data paths used in the input and output of the data.

The data I/O circuit 1105 may include a receiver 1151, a deserializer 1152, a write driver 1153, a write multiplexer 1154, a read multiplexer 1155, a read driver 1156, a serializer 1157, and a transmitter 1158. The receiver 1151 may be synchronized with the internal data clock signal IWCK[0:3] to receive transmission data DQ based on a data reference voltage VREF_DQ. The deserializer 1152 may convert the transmission data DQ inputted in series through the receiver 1151 into parallel data. The write driver 1153 may drive the parallel data to transmit the driven parallel data to the write multiplexer 1154. The write multiplexer 1154 may transmit the data driven by the write driver 1153 to the DRAM core 1106 using a multiplexing technique with an I/O line. The read multiplexer 1155 may output the data outputted from the DRAM core 1106 through the I/O line to the read driver 1156 using a multiplexing technique during the read operation. The read driver 1156 may drive the data outputted from the DRAM core 1106 through the read multiplexer 1155 to output the driven data to the serializer 1157. The serializer 1157 may convert the data outputted from the read driver 1156 into serial data. The transmitter 1158 may output the serial data converted by the serializer 1157 as the transmission data DQ.

The DRAM core 1106 may perform the read operation or the write operation for outputting or receiving the data through the data I/O circuit 1105 based on the read/write control signal RD/WR_Control. The DRAM core 1106 may perform the active operation, the pre-charge operation, or the refresh operation based on the row path control signal ACT/PCG/REF_Control.

What is claimed is:
1. A semiconductor device comprising:
a phase difference detection circuit configured to generate a first phase difference detection signal and a second phase difference detection signal by comparing a phase of a phase detection clock signal, generated from a command/address signal in synchronization with a clock signal, with phases of a division clock signal and an internal division clock signal that are generated by dividing a frequency of a data clock signal according to an operation mode; and
an internal circuit configured to recognize the phases of the division clock signal and the internal division clock signal according to a logic level combination of the first and second phase difference detection signals.
2. The semiconductor device of claim 1,
wherein the operation mode comprises a first operation mode and a second operation mode; and
wherein the phase difference detection circuit is configured to compare the phase of the phase detection clock signal with the phase of the division clock signal to generate the first phase difference detection signal in the first operation mode and is configured to compare the phase of the phase detection clock signal with the phase of the internal division clock signal to generate the second phase difference detection signal in the second operation mode.
3. The semiconductor device of claim 1,
wherein the operation mode comprises a first operation mode and a second operation mode;
wherein in the first operation mode, the division clock signal has the same frequency as the clock signal; and
wherein in the second operation mode, the division clock signal has twice the frequency of the clock signal, and the internal division clock signal has the same frequency as the clock signal.
4. The semiconductor device of claim 1, wherein the phase difference detection circuit comprises:
a command generation circuit configured to be synchronized with the clock signal to generate an internal command including a pulse which is created when a chip selection signal and the command/address signal have a predetermined logic level combination;
a phase detection clock generation circuit configured to be synchronized with the internal command to generate the phase detection clock signal, which is enabled during a predetermined period;

a frequency division circuit configured to divide a frequency of the data clock signal according to a logic level of a mode signal to generate the division clock signal and the internal division clock signal; and a phase comparison circuit configured to compare a phase of the phase detection clock signal with phases of the division clock signal and the internal division clock signal to generate the first and second phase difference detection signals.

5. The semiconductor device of claim 4, wherein the phase detection clock generation circuit comprises:

a selection signal generation circuit configured to generate a first selection signal and a second selection signal, one of which is selectively enabled according to a mode register signal;

a shift register configured to shift the internal command by a period corresponding to "M" times a cycle of the clock signal to generate first and second shift commands (where, "M" is a natural number); and a selection/transmission circuit configured to output any one of the first and second shift commands as the phase detection clock signal according to the first and second selection signals.

6. The semiconductor device of claim 4, wherein the frequency division circuit comprises:

an internal clock generation circuit configured to be synchronized with the data clock signal to generate an internal clock signal and an inverted internal clock signal with a frequency that varies according to the logic level of the mode signal;

a first division circuit configured to divide the frequency of the internal clock signal and the inverted internal clock signal to generate the division clock signal; and a second division circuit configured to divide a frequency of the division clock signal to generate the internal division clock signal according to the logic level of the mode signal.

7. The semiconductor device of claim 4, wherein the phase comparison circuit comprises:

a delay circuit configured to delay the division clock signal to generate a first delayed signal and configured to delay the internal division clock signal to generate a second delayed signal; and a synchronization circuit configured to latch the first delayed signal in synchronization with the phase detection clock signal to generate the first phase difference detection signal and configured to latch the second delayed signal in synchronization with the phase detection clock signal to generate the second phase difference detection signal.

8. A semiconductor device comprising:

a frequency division circuit configured to divide a frequency of a data clock signal according to a logic level of a mode signal for setting a first operation mode or a second operation mode to generate first, second, third, and fourth division clock signals and first, second, third, and fourth internal division clock signals with frequencies that vary and configured to output the fourth division clock signal, the first internal division clock signal, and the third internal division clock signal; and a phase comparison circuit configured to compare a phase of a phase detection clock signal generated in synchronization with a clock signal with a phase of the fourth division clock signal to generate a first phase difference detection signal and configured to compare the phase of the phase detection clock signal with phases of the first and third internal division clock signals to generate a second phase difference detection signal.

9. The semiconductor device of claim 8, wherein the phase comparison circuit is configured to compare the phase of the phase detection clock signal with a phase of the fourth division clock signal to generate the first phase difference detection signal in the first operation mode; and wherein the phase comparison circuit is configured to compare the phase of the phase detection clock signal with phases of the fourth division clock signal and the first and third internal division clock signals to generate the first and second phase difference detection signals in the second operation mode.

10. The semiconductor device of claim 8, wherein in the first operation mode, the first, second, third, and fourth division clock signals are generated to have the same frequency as the clock signal; and wherein in the second operation mode, the first, second, third, and fourth division clock signals are generated to have twice the frequency of the clock signal and the first, second, third, and fourth internal division clock signals are generated to have the same frequency as the clock signal.

11. The semiconductor device of claim 8, wherein the frequency division circuit comprises:

an internal clock generation circuit configured to be synchronized with the data clock signal to generate an internal clock signal and an inverted internal clock signal with a frequency that varies according to the logic level of the mode signal;

a first division circuit configured to divide a frequency of the internal clock signal and the inverted internal clock signal to generate the first, second, third, and fourth division clock signals; and a second division circuit configured to divide a frequency of the first and third division clock signals to generate the first, second, third, and fourth internal division clock signals according to the logic level of the mode signal.

12. The semiconductor device of claim 8, wherein the phase comparison circuit comprises:

a delay circuit configured to delay the fourth division clock signal to generate a first delayed signal, configured to delay the first internal division clock signal to generate a second delayed signal, and configured to delay the third internal division clock signal to generate a third delayed signal; and a synchronization circuit configured to latch the first delayed signal in synchronization with the phase detection clock signal to generate the first phase difference detection signal and configured to latch the second and third delayed signals in synchronization with the phase detection clock signal to generate the second phase difference detection signal.

13. The semiconductor device of claim 12, wherein the delay circuit comprises:

a first delay circuit configured to delay the fourth division clock signal to generate the first delayed signal;

a second delay circuit configured to delay the first internal division clock signal to generate the second delayed signal; and a third delay circuit configured to delay the third internal division clock signal to generate the third delayed signal, wherein the first, second, and third delay circuits each have the same delay time.

14. The semiconductor device of claim 12,
wherein the synchronization circuit is configured to generate the second phase difference detection signal from the second delayed signal when the first phase difference detection signal has a first logic level; and
wherein the synchronization circuit is configured to generate the second phase difference detection signal from the third delayed signal when the first phase difference detection signal has a second logic level.

15. The semiconductor device of claim 12, wherein the synchronization circuit comprises:
a first latch circuit configured to latch the first delayed signal in synchronization with the phase detection clock signal to generate the first phase difference detection signal;
a second latch circuit configured to latch the second delayed signal in synchronization with the phase detection clock signal to generate a first transmission signal;
a third latch circuit configured to latch the third delayed signal in synchronization with the phase detection clock signal to generate a second transmission signal; and
a multiplexer configured to output the first transmission signal as the second phase difference detection signal when the first phase difference detection signal has a first logic level and configured to output the second transmission signal as the second phase difference detection signal when the first phase difference detection signal has a second logic level.

16. A semiconductor device comprising:
a phase difference detection circuit configured to generate a first phase difference detection signal and a second phase difference detection signal by comparing a phase of a phase detection clock signal, generated from a command/address signal in synchronization with a clock signal, with phases of first, second, third, and fourth division clock signals and first, second, third, and fourth internal division clock signals that are generated by dividing a frequency of a data clock signal according to an operation mode, and configured to generate a command pulse having the same phase as the clock signal;
a clock selection circuit configured to output any one of the first, second, third, and fourth division clock signals and the first, second, third, and fourth internal division clock signals as a selection clock signal according to a logic level combination of the first phase difference detection signal and the second phase difference detection signal; and
a phase change circuit configured to perform a domain crossing operation that changes a phase of the command pulse into a phase of the selection clock signal to generate a phase change command pulse.

17. The semiconductor device of claim 16,
wherein the operation mode comprises a first operation mode and a second operation mode; and
wherein the phase difference detection circuit is configured to compare a phase of the phase detection clock signal with phases of the first, second, third, and fourth division clock signals to generate the first phase difference detection signal in the first operation mode and is configured to compare the phase of the phase detection clock signal with the phases of the first, second, third, and fourth internal division clock signals to generate the second phase difference detection signal in the second operation mode.

18. The semiconductor device of claim 16,
wherein the operation mode comprises a first operation mode and a second operation mode;
wherein in the first operation mode, the first, second, third, and fourth division clock signals have the same frequency as the clock signal; and
wherein in the second operation mode, the first, second, third, and fourth division clock signals have twice the frequency of the clock signal, and the first, second, third, and fourth internal division clock signals have the same frequency as the clock signal.

19. The semiconductor device of claim 16, wherein the phase difference detection circuit comprises:
a command generation circuit configured to be synchronized with the clock signal to generate an internal command including a pulse which is created when a chip selection signal and the command/address signal have a predetermined logic level combination, configured to generate the command pulse when the internal command is generated, and configured to generate the command pulse when the internal command is generated;
a phase detection clock generation circuit configured to be synchronized with the internal command to generate the phase detection clock signal, which is enabled during a predetermined period;
a frequency division circuit configured to divide a frequency of the data clock signal according to a logic level of a mode signal to generate the first, second, third, and fourth division clock signals and the first, second, third, and fourth internal division clock signals; and
a phase comparison circuit configured to compare a phase of the phase detection clock signal with phases of the first, second, third, and fourth division clock signals and the first, second, third, and fourth internal division clock signals to generate the first and second phase difference detection signals.

20. The semiconductor device of claim 16, further comprising:
a read/write control circuit configured to be synchronized with the phase change command pulse to generate a pipe input signal and a pipe output signal; and
a data input/output (I/O) circuit configured to receive or output data according to the pipe input signal and the pipe output signal.

21. A semiconductor device comprising:
a phase difference detection circuit configured to generate a first phase difference detection signal and a second phase difference detection signal by comparing a phase of a phase detection clock signal, generated from a command/address signal in synchronization with a clock signal and with phases of first, second, third, and fourth division clock signals and first, second, third, and fourth internal division clock signals that are generated by dividing a frequency of a data clock signal according to an operation mode, and configured to generate a command pulse having the same phase as the clock signal; and
a phase change circuit configured to generate first, second, third, and fourth phase change command pulses by performing a domain crossing operation that changes a phase of the command pulse into any one of phases of the first, second, third, and fourth division clock signals and first, second, third, and fourth internal division clock signals according to a logic level combination of the first and second phase difference detection signals.

22. The semiconductor device of claim 21,
wherein the operation mode comprises a first operation mode and a second operation mode; and
wherein the phase difference detection circuit is configured to compare a phase of the phase detection clock signal with phases of the first, second, third, and fourth division clock signals to generate the first phase difference detection signal in the first operation mode and is configured to compare the phase of the phase detection clock signal with the phases of the first, second, third, and fourth internal division clock signals to generate the second phase difference detection signal in the second operation mode.

23. The semiconductor device of claim 21,
wherein the operation mode comprises a first operation mode and a second operation mode;
wherein in the first operation mode, the first, second, third, and fourth division clock signals have the same frequency as the clock signal; and
wherein in the second operation mode, the first, second, third, and fourth division clock signals have twice a frequency of the clock signal, and the first, second, third, and fourth internal division clock signals have the same frequency as the clock signal.

24. The semiconductor device of claim 21, wherein the phase difference detection circuit comprises:
a command generation circuit configured to be synchronized with the clock signal to generate an internal command including a pulse which is created when a chip selection signal and the command/address signal have a predetermined logic level combination and configured to generate the command pulse when the internal command is generated;
a phase detection clock generation circuit configured to be synchronized with the internal command to generate the phase detection clock signal, which is enabled during a predetermined period;
a frequency division circuit configured to divide a frequency of the data clock signal according to a logic level of a mode signal to generate the first, second, third, and fourth division clock signals and the first, second, third, and fourth internal division clock signals; and
a phase comparison circuit configured to compare a phase of the phase detection clock signal with phases of the first, second, third, and fourth division clock signals and the first, second, third, and fourth internal division clock signals to generate the first and second phase difference detection signals.

25. The semiconductor device of claim 21,
wherein the operation mode comprises a first operation mode and a second operation mode; and
wherein the phase change circuit comprises:
a first phase change circuit configured to be synchronized with the first division clock signal to output the command pulse as the first phase change command pulse when the first phase difference detection signal has a first logic level in the first operation mode and configured to be synchronized with the first internal division clock signal to output the command pulse as the first phase change command pulse when the first phase difference detection signal has the first logic level and the second phase difference detection signal has the first logic level in the second operation mode;
a second phase change circuit configured to be synchronized with the second internal division clock signal to output the command pulse as the second phase change command pulse when the first phase difference detection signal has the first logic level and the second phase difference detection signal has a second logic level in the second operation mode;
a third phase change circuit configured to be synchronized with the third division clock signal to output the command pulse as the third phase change command pulse when the first phase difference detection signal has the second logic level in the first operation mode and configured to be synchronized with the third internal division clock signal to output the command pulse as the third phase change command pulse when the first phase difference detection signal has the second logic level and the second phase difference detection signal has the first logic level in the second operation mode; and
a fourth phase change circuit configured to be synchronized with the fourth internal division clock signal to output the command pulse as the fourth phase change command pulse when the first phase difference detection signal has the second logic level and the second phase difference detection signal has the second logic level in the second operation mode.

26. The semiconductor device of claim 21, further comprising:
a read/write control circuit configured to be synchronized with the first, second, third, and fourth phase change command pulses to generate a pipe input signal and a pipe output signal; and
a data input/output (I/O) circuit configured to receive or output data according to the pipe input signal and the pipe output signal.

27. The semiconductor device of claim 26,
wherein the operation mode comprises a first operation mode and a second operation mode; and
wherein the read/write control circuit comprises:
a first read/write control circuit configured to be synchronized with the first phase change command pulse to generate the pipe input signal and the pipe output signal when the first phase difference detection signal has a first logic level in the first operation mode and configured to be synchronized with the first phase change command pulse to generate the pipe input signal and the pipe output signal when the first phase difference detection signal has the first logic level and the second phase difference detection signal has the first logic level in the second operation mode;
a second read/write control circuit configured to be synchronized with the second phase change command pulse to generate the pipe input signal and the pipe output signal when the first phase difference detection signal has the first logic level and the second phase difference detection signal has a second logic level in the second operation mode;
a third read/write control circuit configured to be synchronized with the third phase change command pulse to generate the pipe input signal and the pipe output signal when the first phase difference detection signal has the second logic level in the first operation mode and configured to be synchronized with the third phase change command pulse to generate the pipe input signal and the pipe output signal when the first phase difference detection signal has the second logic level and the second phase difference detection signal has the first logic level in the second operation mode; and
a fourth read/write control circuit configured to be synchronized with the fourth phase change command pulse to generate the pipe input signal and the pipe output signal when the first phase difference detection signal has the second logic level and the second phase difference detection signal has the second logic level in the second operation mode.

* * * * *